United States Patent
Clarridge et al.

(10) Patent No.: US 6,584,421 B1
(45) Date of Patent: Jun. 24, 2003

(54) PDA INSTRUMENT/PROCESS CALIBRATOR

(75) Inventors: Ron Clarridge, Webster, NY (US); Lewis Frank, Rochester, NY (US); Bill Gustafson, Rochester, NY (US); Mike Pantano, Kent, NY (US); Tim Tetreault, West Henrietta, NY (US); Ken Vandewater, Spencerport, NY (US); Xu-Ming Wang, Rochester, NY (US)

(73) Assignee: Fluke Corporation, Rochester, NY (US)

( * ) Notice: Subject to any disclaimer, the term of this patent is extended or adjusted under 35 U.S.C. 154(b) by 0 days.

(21) Appl. No.: 09/638,337

(22) Filed: Aug. 14, 2000

(51) Int. Cl.[7] .............................................. G06F 19/00
(52) U.S. Cl. ...................................... 702/85; 702/116
(58) Field of Search .................. 702/85, 104, 116–117; 709/213, 214, 216; 710/62, 72–74; 379/93.05, 93.25; 439/928.1, 945–946

(56) References Cited

U.S. PATENT DOCUMENTS 5,666,495 A  *  9/1997  Yeh .............................. 710/62
6,241,537 B1  *  6/2001  Tate et al. ................ 439/928.1
6,266,539 B1  *  7/2001  Pardo .......................... 455/556
6,308,201 B1  * 10/2001  Pivowar et al. ............. 709/214

OTHER PUBLICATIONS

Stephen Jacobs, Kodak turns the Palm into a camera, Democrat & Chronicle, Jun. 12, 2000, 2 pages, Rochester, New York.

Palm–SPEC ™ Spectrophotometer, product sheets, 5 pages, www.Oceanoptics.com, Jun. 5, 2000.

Gaagetrak ™ V4, The world standard in calibration management software, 1 page. http://qualitymag.com/quick info.

Ionics announces Pocket Genesis for Pocket PC, 1 page, www.controleng.com.

Michael Bradford, High technology keeps Disney's risks in hand, 2 pages. Reprint from Business Insurance, a publication of Crain Communications Inc. Feb. 7, 2000.

Datastick Systems. My Corder Products. 8 sheets, product sheets, etc. www.datastick.com.

Tangent Systems, Inc. Group of 7 product sheets in folder relating to VERSID.

* cited by examiner

Primary Examiner—Bryan Bui
(74) Attorney, Agent, or Firm—Stephen B. Salai, Esq.; Donna P. Suchy, Esq.; Harter, Secrest & Emery LLP

(57) ABSTRACT

An instrument of process calibrator includes a housing, a traceable, controllable calibration source in the housing, the calibration source including memory for storing identifying information about the calibration source, a data connector coupled to the calibration source, a removable hand held computer preferably a PDA, attached to the housing, and connected to the data connector, the computer including user input means for receiving a control input user for controlling the calibration source, and output means, preferably graphical output means for displaying the identifying information and calibration results to the user.

16 Claims, 42 Drawing Sheets

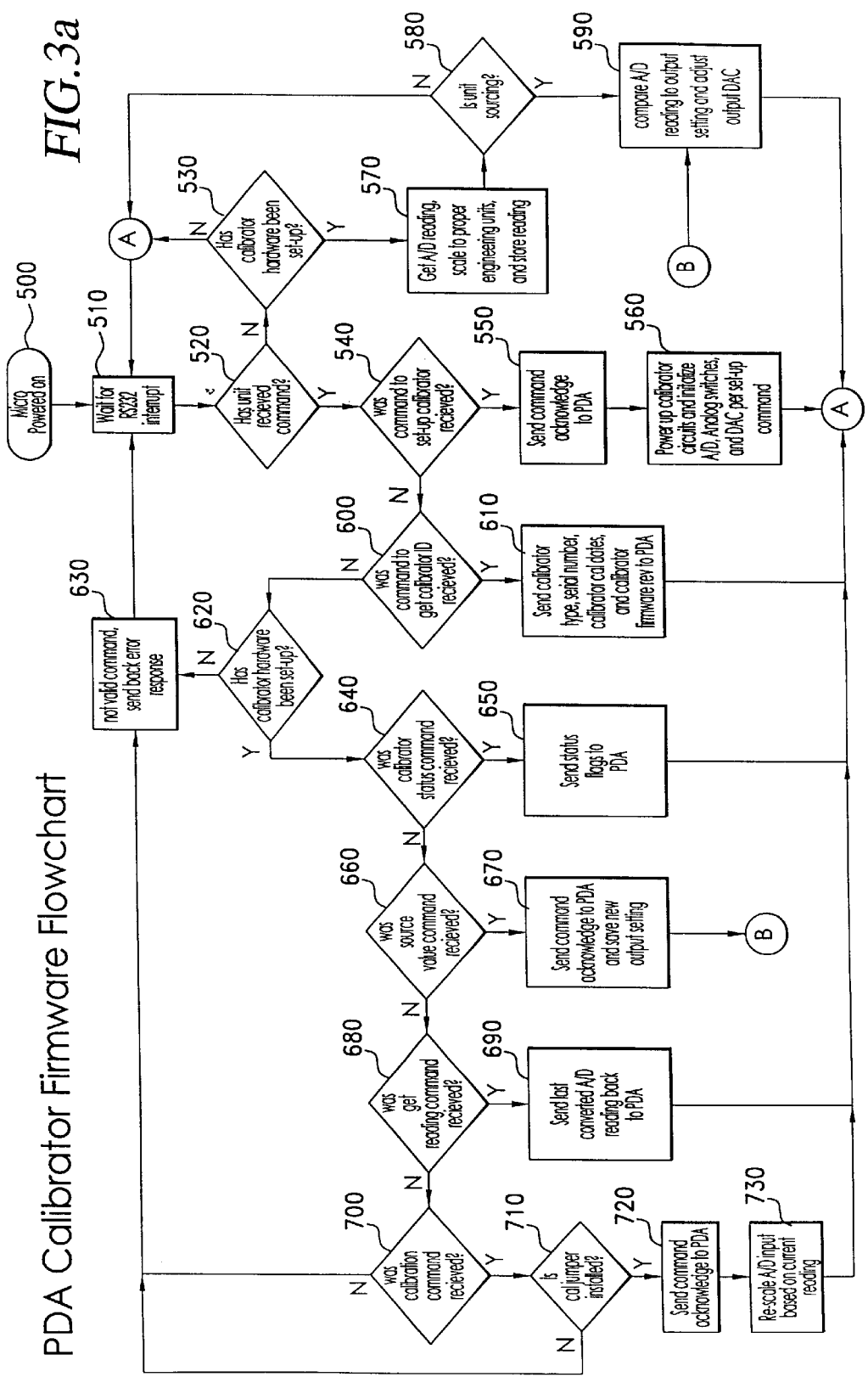

FIG.6

| Name | Exist on Palm | Exist on PC | Hot Synch'd |
|---|---|---|---|
| Instrument | Yes | Yes | Yes |
| Calibrator/Asset | Yes | Yes | Yes |
| Calibration Procedure | Yes | Yes | Yes |
| Calibration Results (2 Tables: Info&Data) | Yes | Yes | Yes |
| Manufacturer | Yes | Yes | Yes |
| Instrument Location | Yes | Yes | Yes |
| Engineering Units | Yes | Yes | Yes |
| User | Yes | Yes | Yes |
| Calibration History (2 Tables: Info&Data) | No | Yes | No |
| Company | No | Yes | No |
| Access | No | Yes | No |

FIG.7

| Field Name | Type |
|---|---|
| Instrument Index | AutoNumber-Key |
| Tag | Text |
| Loop | Text |
| Location Index | Number |
| Manufacturer Index | Number |
| Model | Text |
| Serial Number | Text |
| Last Cal Date | Date |
| Cal Due Date | Date |
| Calibration Interval (Days) | Number |
| Description | Text |
| Input Engineering Units Index | Number |
| Input Zero Scale Value | Float Number |
| Input Full Scale Value | Float Number |
| Output Engineering Units Index | Number |
| Output Zero Scale Value | Float Number |
| Output Full Scale Value | Float Number |
| Error Unit | Enumeration: %FS,Eng.Units |
| Allowable Error | Float Number |

FIG.8

| Field Name | Type |
|---|---|
| Calibrator Index | AutoNumber-Key |
| Manufacturer Index | Number |
| Model | Text |
| Serial Number | Text |
| Last Cal Date | Date |
| Cal Due Date | Date |
| Calibration Interval | Number |
| Description | Text |

FIG.9

| Field Name | Type |
|---|---|
| Calibration Procedure Index | AutoNumber-Key |
| Name | Text |
| Instructions | Text |

FIG.10

| Field Name | Type |
|---|---|
| Calibration Results info Index | AutoNumber-Key |
| Instrument Index | Number |
| Procedure Index | Number |
| Date/Time | Date/Time |
| Operator | Text |
| Ambient Temperature | Text |
| Relative Humidity | Text |
| Barometric Pressure | Text |
| Description | Text |
| Calibrator 1 Index | Number |
| Calibrator 2 Index | Number |
| Calibrator 3 Index | Number |
| Calibrator 4 Index | Number |
| Device Input Data Entry | Enumeration: Manual Entry/Auto-Calibrator Input/Auto-Calibrator Output/Auto-Calibrator Pressure (MAP only) |
| Device Output Data Entry | Enumeration: Manual Entry/Auto-Calibrator Input/Auto-Calibrator Output/Auto-Calibrator Pressure (MAP only) |
| Number Calibration Points | Number |
| Calibration Completed | Boolean |
| In Tolerance | Boolean |

FIG.11

| Field Name | Type |
|---|---|
| Calibration Results Data Index | AutoNumber-Key |
| Calibration Results Info Index | Number |
| Data Type | Enumeration: AsFound/AsLeft |
| Device Expected Input | Number |
| Device Actual Input | Number |
| Device Expected Output | Number |
| Device Actual Output | Number |
| Error Limit | Number |
| Actual Error | Number |
| Pass | Boolean |

FIG.12

| Field Name | Type |
|---|---|
| Manufacturer Index | AutoNumber-Key |
| Manufacture Name | Text |

FIG.13

| Field Name | Type |
|---|---|
| Location Index | AutoNumber-Key |
| Location 1 | Text |
| Location 2 | Text |
| Location 3 | Text |

FIG.14

| Field Name | Type |
|---|---|
| Engineering Units Index | AutoNumber-Key |
| Units Name | Text |

FIG.15

| Field Name | Type |
|---|---|
| User Index | AutoNumber-Key |
| User First Name | Text |
| User Last Name | Text |
| User Id | Text |
| Password | Text |
| Access Index | Number |

FIG.16

| Field Name | Type |
|---|---|
| Company Index | AutoNumber-Key |
| Company Name | Text |
| Address 1 | Text |
| Address 2 | Text |
| CityStateZipCode | Text |

FIG.17

| Field Name | Type |
|---|---|
| Access Index | AutoNumber-Key |
| Description | Text |
| Level | Number |

PDA INSTRUMENT/PROCESS CALIBRATOR

FIELD OF THE INVENTION

This invention relates generally to instrument calibrators and more particularly to an instrument calibrator combined with a hand held personal computer, preferably a personal digital assistant (PDA) having graphical input and output, and a stylus for user interaction with the graphical interface.

BACKGROUND OF THE INVENTION

The use of calibrators for regularly verifying the accuracy of instruments used in process automation and other applications has been known for some time. Manual calibrators provide a signal source of traceable accuracy and, optionally, measuring capabilities. The most basic calibration method includes the steps of connecting the verifiable source to the instrument or device being calibrated and noting the reading or action produced by the instrument in response to the source. If the response or reading is within predetermined acceptable limits, the reading is simply recorded along with the date and additional information such as the operator's name, and identification code for the calibrator, the identity of the device being calibrated and similar information. If the instrument reading is outside acceptable limits, remedial steps are taken to recalibrate the instrument or device.

For example, process instrumentation commonly utilizes a current control signal in the range of 4 to 20 milliamps. A device such as a valve is connected in an open or closed loop control system that controls the position of the valve. Conventionally, a 4 milliamp signal completely closes the valve while a 20 milliamp signal completely opens the valve or vice versa. A metering device. such as a current meter can be connected to the valve to monitor the magnitude of the current signal applied to the valve. Alternatively, a recorder such as a chart record may be connected to record the position of the valve during a process. Both the accuracy of the recording instrument and the response of the valve to the control signal must be periodically tested to insure proper operation of the process.

Calibrators that provide a-traceable verifiable signal in the 4 to 20 milliamp range are widely employed for this purpose.

It is desirable to retain the information associated with the calibration of process instrumentation for some time after the calibration has been carried out so that the performance of the instruments can be monitored. Therefore, it has been common to keep written records or enter data taken by calibration technicians into a database for later retrieval, for the analysis of trends and for other purposes including verifying that the necessary periodic calibrations have been in fact carried out.

For the most part, data related to calibration has been recorded manually on forms provided for that purpose, and thereafter entered into a database, if required, usually maintained on a personal compute, directly from the forms. This approach is time consuming, labor intensive, and may lead to errors unless great care is taken in the recording of the data, the entry of the data into a computer, and the verification of the entered data.

To avoid some of these time consuming, error prone manual steps, documenting calibrators have been introduced. Documenting calibrators automate one or more of the steps previously performed manually. Documenting calibrators typically provide both a traceable source and measurement capability in a single unit. Documenting calibrators typically include memory for recording measured data to eliminate the need for manually entering the data on a form. Some documenting calibrators provide multiple functions in a single unit. For example, a documenting calibrator may provide a traceable voltage and current sources as well as variable frequency sources. Simulated thermocouple output sources may also be provided.

While documenting calibrators provide a number of advantages over more basic calibrators, they are presently quite expensive and even more important, require extensive set up before they can be used. Information concerning the device or instrument to be calibrated must be entered into the documenting calibrator before a calibration procedure can be carried out. Existing documenting calibrators require that information concerning each instrument to be calibrated including the identification of the instrument, its location, the procedure for making the calibration, and the identity of the calibrator be downloaded to the documenting calibrator each time a new instrument or device is added to those already calibrated. This process is inconvenient and time consuming, and requires that the documenting calibrator be physically connected to a stand alone computer each time a new instrument/device is added. Among the data that must be downloaded to the documenting calibrator are tag. IDs and associated calibration procedures.

There is a need for an instrument/process calibrator that overcomes the disadvantages of manual calibrators, and at the same time increases the convenience of documenting calibrators by making them easier to use and more versatile.

It is an object of this invention to provide an instrument or process calibrator that uses a general purpose computer, preferably a personal digital assistant (PDA) or similar device to provide the human interface to the calibrator, to store information relating to the calibration itself, so as to automate, to a greater or lesser extent, the calibration process, and to store the results of the calibration.

It is another object of this invention to provide a general purpose computer, preferably a personal digital assistant, that is configured to both store information concerning an instrument or process to be calibrated, and provide for the entry and storage of data taken during the calibration process.

It is a further object of this invention to provide an instrument/process calibrator that uses a portable general purpose computer to temporarily store calibration information and results during the calibration process, and to upload that information to a database on another computer for long term storage and analysis.

SUMMARY OF THE INVENTION

Briefly stated, and in accordance with a presently preferred embodiment of the invention, an instrument or process calibrator includes a housing, a traceable, controllable calibration source in the housing, the calibration source including memory for storing identifying information about the calibration source, a data connector coupled to the calibration source, a removable hand held computer preferably a PDA, attached to the housing, and connected to the data connector, the computer including user input means for receiving a control input user for controlling the calibration source, and output means, preferably graphical output means for displaying the identifying information and calibration results to the user.

In accordance with another aspect of the invention, the hand held computer includes an input device for receiving calibration data from a user and memory for storing the calibration data.

In accordance with another aspect of the invention, the hand held computer includes an output circuit for transferring the stored calibration data and the identifying information to another computer.

In accordance with another aspect of the invention, the hand held computer or PDA includes a touch screen for receiving data and control inputs from the user.

The PDA calibrator of this invention utilizes a common user interface to a family of calibrators. By providing a familiar interface, different calibrators may be used by a previously trained technician without the need for extensive additional training. The use of a consistent familiar graphical interface eliminates the usual array of buttons and knobs that traditional hand held calibrators have required for operation. The common interface permits operators to be trained quickly, and eliminates the need for retraining for new calibrator devices. The ability to transfer data from the PDA to a host computer and back provides a fast and simple link to share data and files with the host computer. The host computer is not required, however, as the software resident in the PDA can operate on a stand alone basis if required.

The calibrators of this invention include both source and read functions with accuracies equal to or exceeding existing calibrators. The calibrators of this invention are low cost alternatives to single purpose documenting calibrators in current use. By eliminating the need to transfer information relating to new instruments from a host computer to a documenting calibrator, the PDA calibrator of this invention provides unprecedented versatility at low cost. The PDA calibrators can operate on a stand alone basis to allow a calibration technician to use the PDA and its accompanying software if the field to build a device data base with each new calibration, thereby eliminating the time consuming need to prepopulate a data base from a host computer prior to performing calibrations.

The PDA calibrator is adapted to integrate easily with existing maintenance practices and systems.

The PDA calibrator of this invention allows calibration data to be gathered and shared much more easily than heretofore possible. A calibration technician using the PDA calibrator on the plant floor, can gather, evaluate and share information company wide and even worldwide much more efficiently than has been heretofore possible.

A PDA calibrator in accordance with this invention can be used by a technician to calibrate a new instrument by entering information on the instrument or device to be calibrated into the PDA using the PDA graphical user interface and a pen or stylus. If information concerning the device or instrument already exists and and can be easily retrieved from data stored on the PDA.

While the preferred embodiment of the invention utilizes a calibrator base to perform the calibration, thereby allowing data to be read directly from the calibrator, data can be entered manually on the PDA if desired, for example if no suitable calibrator base is available. The PDA software operates on a stand alone basis that can be used either with or without a calibrator attached to the PDA. This allows non-electronic calibrations that are normally made manually, such as scales and gas analyzers to be performed, using the PDA calibrator.

As calibrations are completed, non-automatically retrieved calibration information is entered on the PDA, and the results of the calibration are uploaded to the host computer via a hot sync data transfer function. This creates a permanent electronic record and allows the user to create a variety of records including certificates of calibration if desired. A variety of desk top applications already in existence can be easily interfaced with the PDA calibrator.

By utilizing existing PDAs, technicians using the PDA calibrators have access to all other functions of the PDA, which allow them to schedule the work and appointments, download compatible third party software such as conversion and electrical calculators and look up tables, all enhancing their overall productivity.

BRIEF DESCRIPTION OF THE DRAWINGS

The novel aspects of the invention are set forth with particularity in the appended claims. The invention itself, together with further objects and advantages thereof may be more readily comprehended by reference to the following detailed description of a presently preferred embodiment thereof, taken in conjunction with the accompanying drawings, in which:

FIG. 3A is a block diagram showing the operation of the calibration base portion of the PDA calibrator;

FIG. 6 is a list of tables stored on the PDA, host computer or both;

FIG. 7 is a list of the fields in the instrument table;

FIG. 8 is a list of the fields in the calibrator table;

FIG. 9 is a list of the fields in the calibration procedure table;

FIG. 10 is a list of the fields in the calibration results info table;

FIG. 11 is a list of the fields in the calibration results data table;

FIG. 12 is a list of the fields in the manufacturer table;

FIG. 13 is a list of the fields in the location table;

FIG. 14 is a list of the fields in the engineering units table;

FIG. 15 is a list of the fields in the user table;

FIG. 16 is a list of the fields in the company table;

FIG. 17 is a list of the fields in the access table;

DETAILED DESCRIPTION OF THE PREFERRED EMBODIMENT

Figure 1:
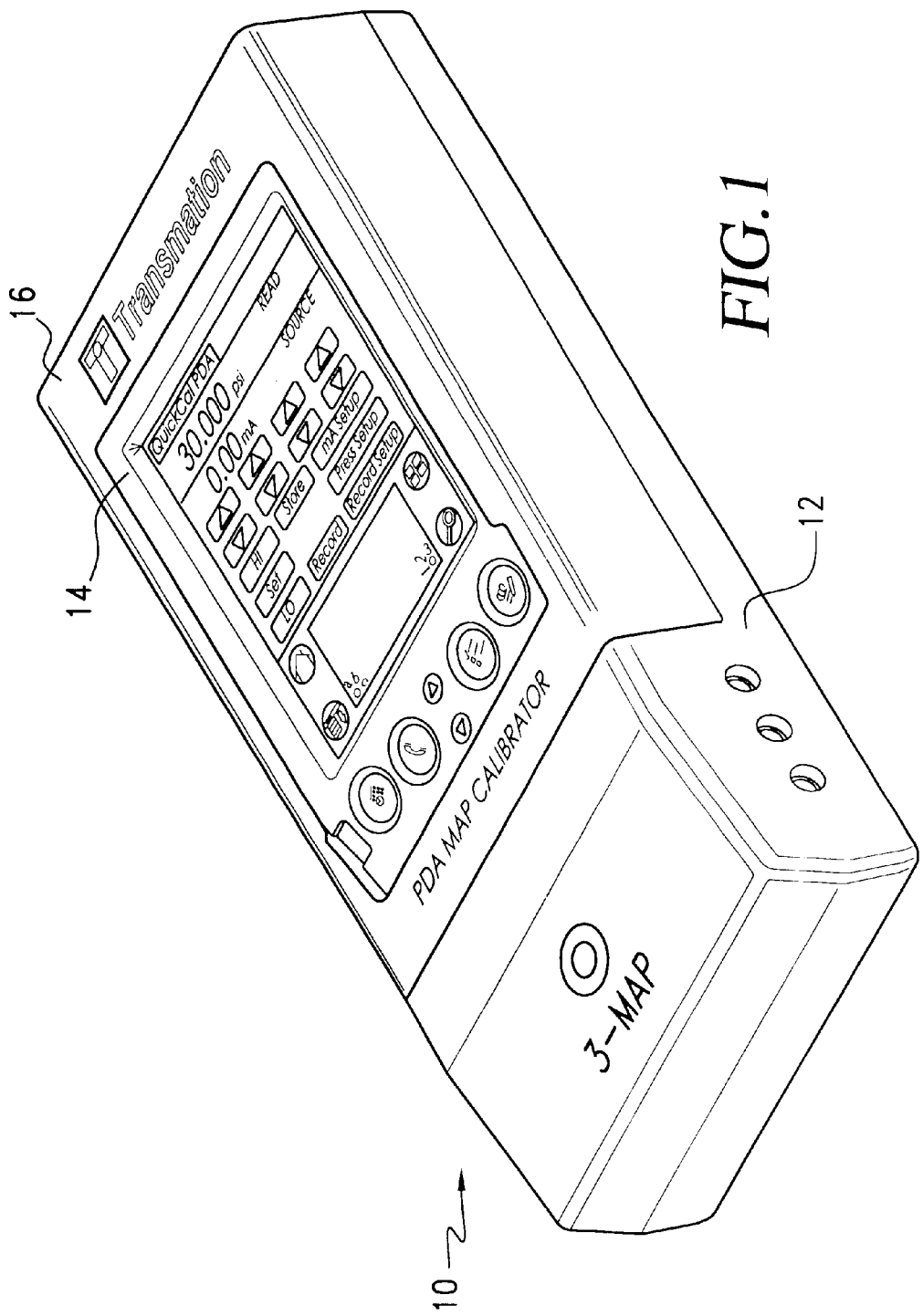
FIG. 1 is a drawing of a PDA calibrator in accordance with this invention.

Referring now to FIG. 1, a PDA calibrator designated generally at 10 includes a base 12 in which the calibration source and associated control and interface circuitry are housed. A general purpose hand held computer, such as a personal digital assistant 14 is physically attached to the base by a slidable removable cover 16 and electrically connected by a connector to be shown and described below.

Figure 2:
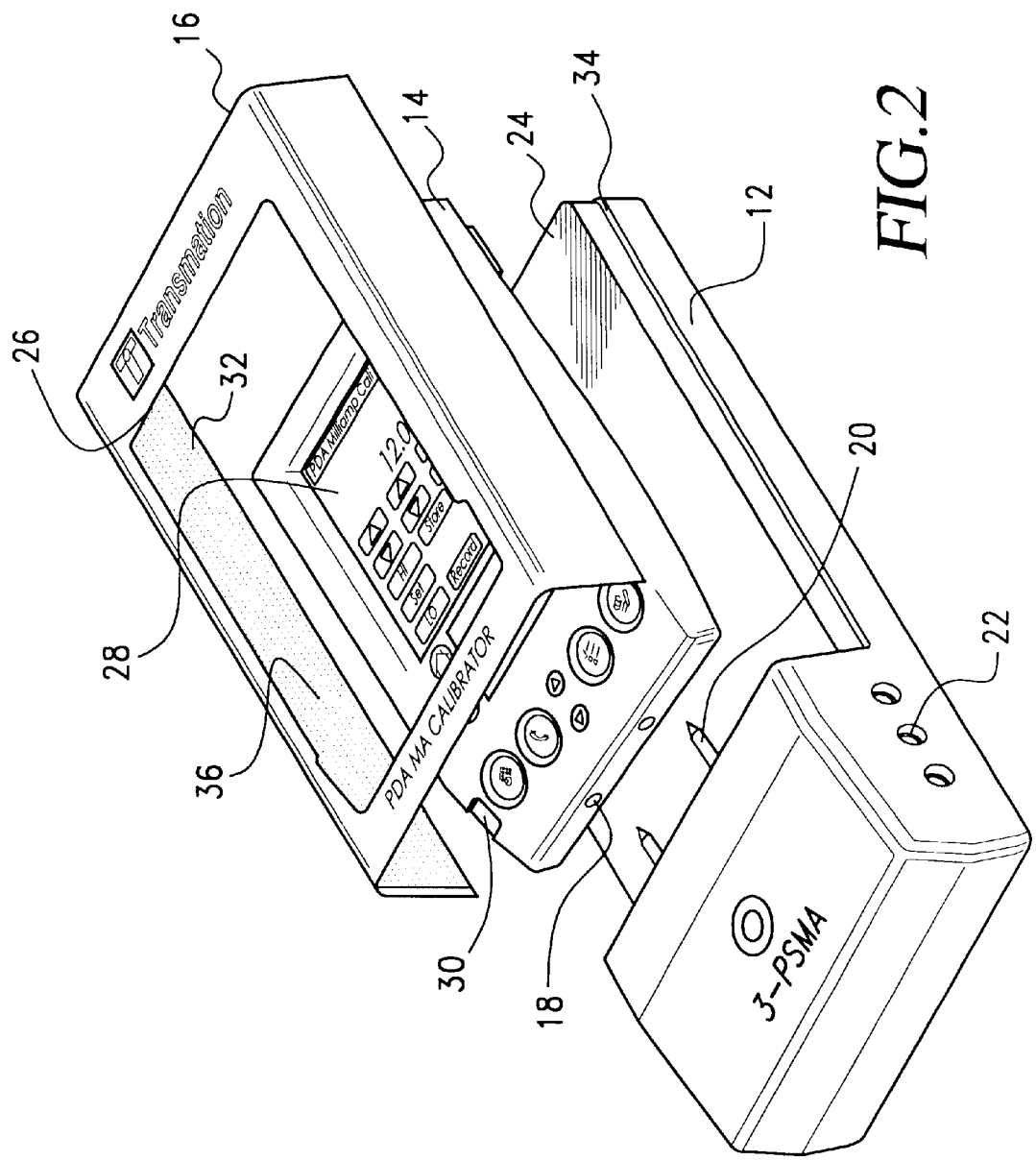
FIG. 2 is a drawing of the base portion of the PDA calibrator.

FIG. 2 is an exploded view of the PDA calibrator showing the components thereof separately. The calibrator base 12 preferably includes a plurality of connectors 22 to which test leads are attached for connecting the calibrator to an instrument or process device to be calibrated. The base has a generally flat surface 24 on which a general purpose computer, such as a personal digital assistant 14 rests. A connector 18 on PDA 14 engages a connector 20 on the calibrator base 12 to provide for communication between the PDA 14 and the calibrator base 12. A preferably stamped metal cover 16 holds the PDA 14 to the base 12. While stamped metal is preferred, other materials such as plastic of suitable rigidity may also be used. Cover 16 preferably has an opening 26 through which the touch screen 28 of the PDA can be viewed and accessed, and through which the control button 30 can be operated.

Preferably, cover 16 has inwardly extending flanges 32 that engage grooves 34 on the sides of the calibrator base to firmly hold the cover and the PDA to the base. Cover 16 is also preferably provided with strips of resilient material, such as foamed rubber, felt strips 36 or the like to securely hold the PDA 14 in position and protect it from damage by scratching or the like.

While a slidably mounted cover is preferred, hinges or other means of attaching the cover to the base may also be employed, so long as the cover can be opened or removed to provide access to the PDA, and closed or attached to firmly hold the PDA to the base with the connectors engaged.

Figure 3:
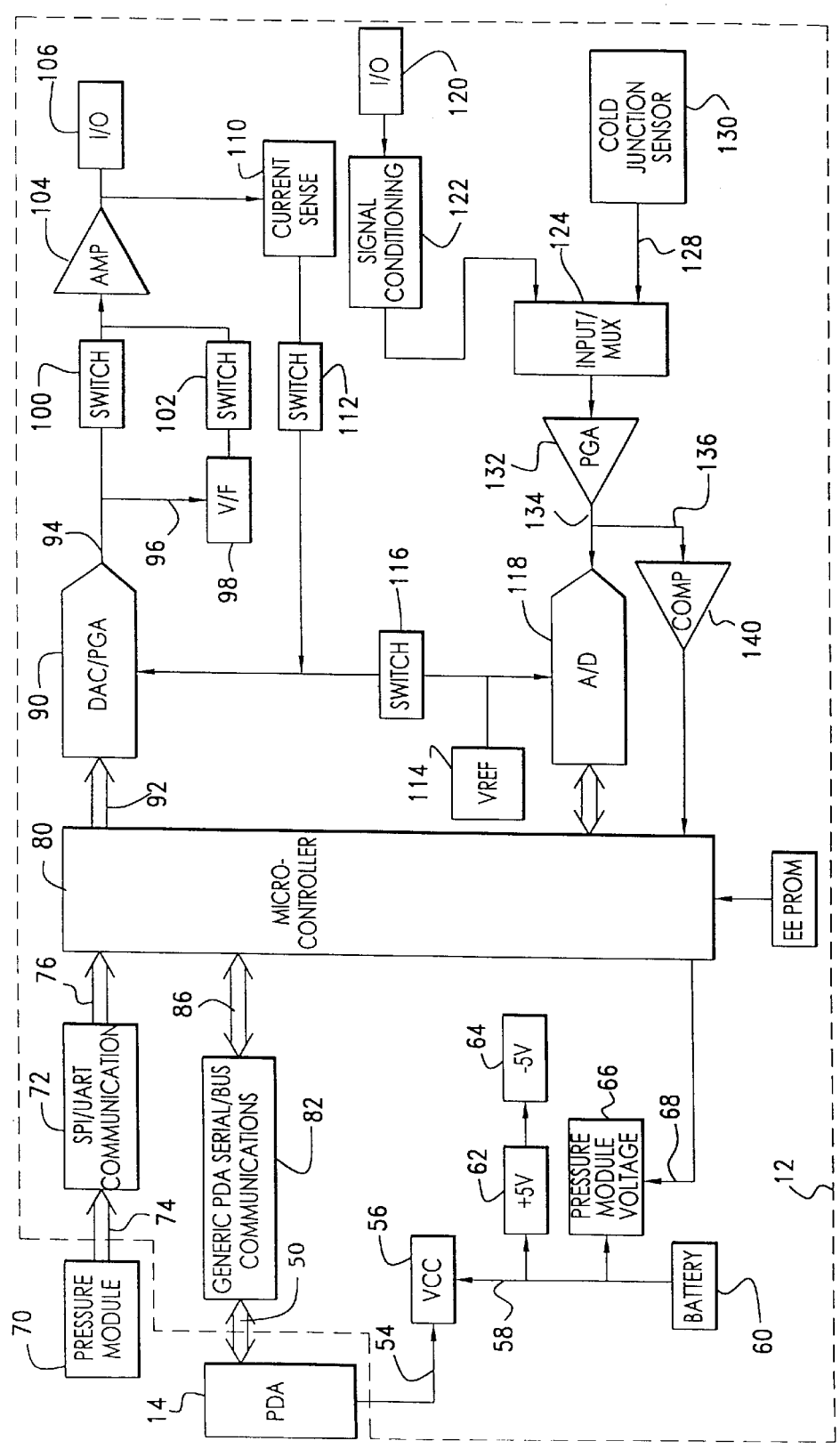
FIG. 3 is a drawing of the PDA portion of the PDA calibrator of this invention connected to an external computer for transferring data.

FIG. 3 is a block diagram of the circuit of a presently preferred embodiment of the PDA calibrator of this invention. PDA 14, which may be any portable general purpose computer or hand held personal digital assistant including, but not limited to PDAs made by any particular manufacturer or even PDAs utilizing any of a variety of available operating systems. Compatible operating systems include PALM-OS, Windows CE, and others.

PDA 14, is connected to calibrator base 12 by a multi pin connector 50 that carries a plurality of serial communication lines and a DC power line. Power line 54 is connected to a voltage control module 56 which has an input 58 connected to a battery 60. Battery 60 is also connected to a +5 volt regulator 62 and −5 volt converter 64 which provide operating voltages to other components of the calibrator base.

Battery 60 is also connected to pressure, module voltage control circuit 66 that provides operating voltage to a pressure calibration module 70, and also responds to a pressure shut down signal applied to input 68 to shut down power to pressure module 70.

Pressure module 70 is connected to interface 72, which is preferably a serial pressure interface/UART signal converter by way of an input connector 74. Output 76 of interface 72 is connected to data and clock input/output terminals of programmable micro controller 80.

PDA interface connector 50 is connected to generic PDA serial/bus communications adapter 82. Adapter 82 provides signal conditioning and timing functions for bi-directional data transfer between PDA 14 and microcontroller 80 by way of clock and data connections 86. Micro controller 80 is a general purpose programmable micro computer that includes both random access memory and program memory. The operation of micro controller 80 as controlled by software resident in the program memory will be described below. While the presently preferred embodiment of the invention uses serial RS-232 protocol, the invention is not so limited. Other parallel or serial interfaces such as USB, RS432 or the like may be employed. The invention is not limited to any particular parallel or serial protocol.

Micro controller 80 may be any of a number of suitable micro controllers, such as an MC68HC705L16 manufactured by Motorola or a similar general purpose microcontroller.

Micro controller 80 is connected to digital to analog converters/programmable gain amplifier (PGA) 90 by data bus 92. The output 94 of DAC/PGA 90 is connected to an input 96 of voltage to frequency converter 98. Switches 100 and 102 selectively insert or remove voltage to frequency converter 98 from the circuit, so that amplifier 104 provides either a controlled voltage signal of a controlled frequency signal to input output port 106. The output of output amplifier 104 is also connected to an input of current sense circuit 110. The output of current sense circuit 110 is connected through a switch 112 to a voltage reference input of DAC/PGA 90. A voltage reference source 114 is connected to DAC/PGA 90 by way of switch 116, and to A/D converter 118.

An input signal is applied to input/output port 120 and then to signal conditioner 122. An output of signal conditioner 122 is connected to an input of multiplexer 124, which has another input 128 connected to the output of a cold junction sensor 130. Output of multiplexer 124 is connected to a programmable gain amplifier 132 having an output 134 connected to an input of A/D converter 118. The output of A/D converter 118 is connected to micro controller 80. Output of PGA 132 is also connected to an input 136 of frequency read comparator 140, the output of which is connected to an input of micro controller 80.

Much of the calibrator circuitry just described is similar in implementation to known calibrators. The novel aspects of the invention lie in the interface to the PDA, and the software running on the micro controller, which will now be described.

FIG. 3A is a flow chart showing the operation of the calibrator base software. Flow commences at block 500 when power is first applied to the calibrator base, usually by the attachment of PDA 14 which is detected by the calibrator base.

The micro controller enters an event driven state 510 where it awaits an interrupt generated by an incoming signal from the PDA. When a command is received at block 520, the software verifies that the calibrator hardware has been set up in block 530. If it has not, control reverts to block 510. For convenience, two notes have been labeled A and B respectively. To simplify the drawing, lines connecting these notes have been omitted but they are in fact connected that is each of the notes labeled A is connected to the other note labeled A, and each of the notes labeled B is connected to the other note labeled B.

If a command is received, the software checks to see if it was a set up command in block 540. If it was, the command is acknowledged in block 550, and the calibrator is powered up, the A-D converters are initialized and the analog switches and digital to analog conditions are initialized.

It should be understood that the hardware portions of the calibrator base other than the portions relating to the PDA, the PDA interfaces, and the hardware and software for communicating with the PDA are substantially similar to known calibrators, and therefore will not be described in detail.

After set up as set forth in block 560 is completed, control reverts to block 510.

After the unit has been set up, flow from block 530 proceeds to block 570, where readings are taken from the analog to digital converter, scaled to the proper engineering units and stored pending request for readings. If the unit is not in the sourcing mode as tested at block 580, the software loops so that new readings are constantly obtained and stored. If the unit is in the sourcing mode, flow proceeds to block 590. The analog to digital converter reading is compared to the desired output setting, and the output digital to analog converter is adjusted to set the source to the desired value. Flow then reverts to block 510.

If a command is other than a set up command, flow proceeds to block 600. If the command is a request for the calibrator ID, flow proceeds to block 610, and the calibrator type, serial number, calibration dates and thermo revision number are transmitted to the PDA. If the command is not a request for calibrator ID information, flow proceeds to block 620. If the calibrator hardware has not been set up, flow proceeds to block 630, an error message is sent to the PDA and flow reverts to block 510. If the calibrator hardware has been set up, the command is tested at block 640. If the command is a calibrator status command, the controller sends the calibrator status flags to the PDA for display as shown in box 650, whereupon flow reverts to block 510. If the command is not a calibrator status command, it is tested at block 660. If the command is a source of value command, flow proceeds to block 670, the command is acknowledged to the PDA and the new output source setting is saved in a register. Flow then proceeds to block 590, where the analog to digital converter reading is compared to the stored source output setting and flow proceeds as already described.

If the command is not a source value command, it is tested again at block 680. If the command is a read command, the last stored value from block 570 is sent to the PDA as shown in block 690, and flow reverts to block 510. If the command is not a read command, flow proceeds to block 700. If the command is a calibrate command, the software tests whether a calibration jumper is installed at block 710, and if it is, the command is acknowledged to the PDA, the analog to digital converter input is rescaled based on the current reading, and flow reverts to block 510. If the calibration jumper is not installed, the unit is not set to calibrations and an error message is returned at block 720, 730 and flow reverts to block 510.

Figure 4:
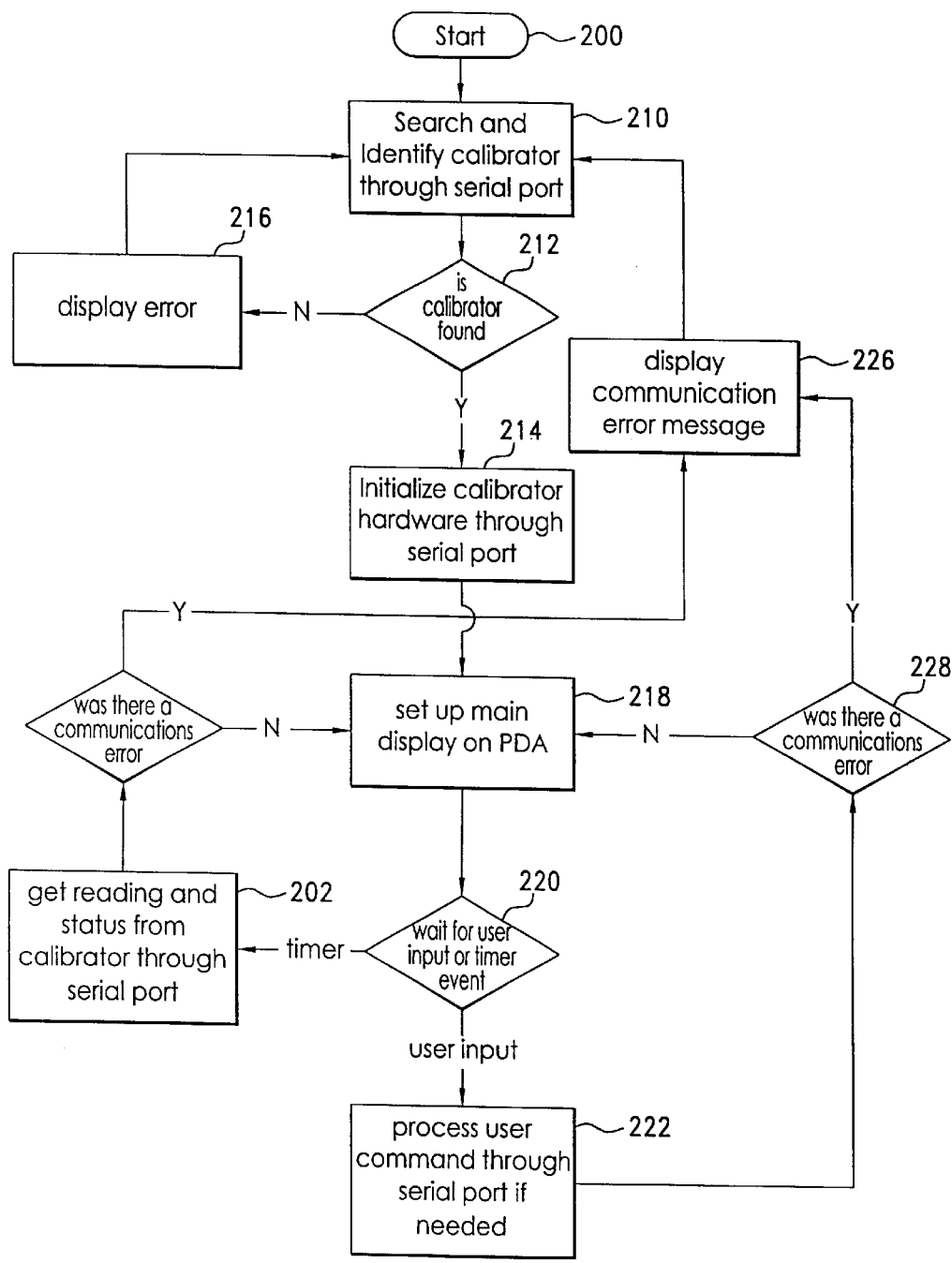
FIG. 4 is a block diagram showing the operation of the PDA resident software of the PDA calibrator.

FIG. 4 is a flow chart showing the manner in which software in the PDA interacts with the calibrator base. After the user starts the application on the PDA, in a manner determined by the PDA user interface, operation commences at start block 200. As shown in block 210, the PDA generates a signal transmitted through serial bus adapter 82 to the micro controller to receive data identifying the calibrator. In this way, software operating on the PDA can be used, without modification, with a variety of calibrators, for example voltage calibrators, current calibrators, thermo couple calibrators and the like. If a valid calibrator identification word is found, then the test carried out at block 212 succeeds, and the PDA initializes the calibrator by sending an appropriate signal through the serial port to micro controller 80, as shown in block 214. If a valid calibrator identification word is not found, routine 216 displays an error and flow returns to block 210. Once initialization is completed, the main display on the PDA is set up in block 218. The program then waits at block 220 for a user input which is processed at block 222, or the expiration of a time out timer whereupon calibrator status and signal level are retrieved from the calibrator at block 202 through the serial port shown at 222, and, if no communications error occurred, displayed on the main display in block 218. If a communications error occurs, a suitable error message is displayed at block 226 and control reverts to block 210. If processing a user command produces an error as determined at block 228, an error message is displayed at block 226 and control reverts to block 210. Otherwise, control returns to block 218 where the results of the user process are displayed and the timer is reset to wait for another user input.

Figure 5:
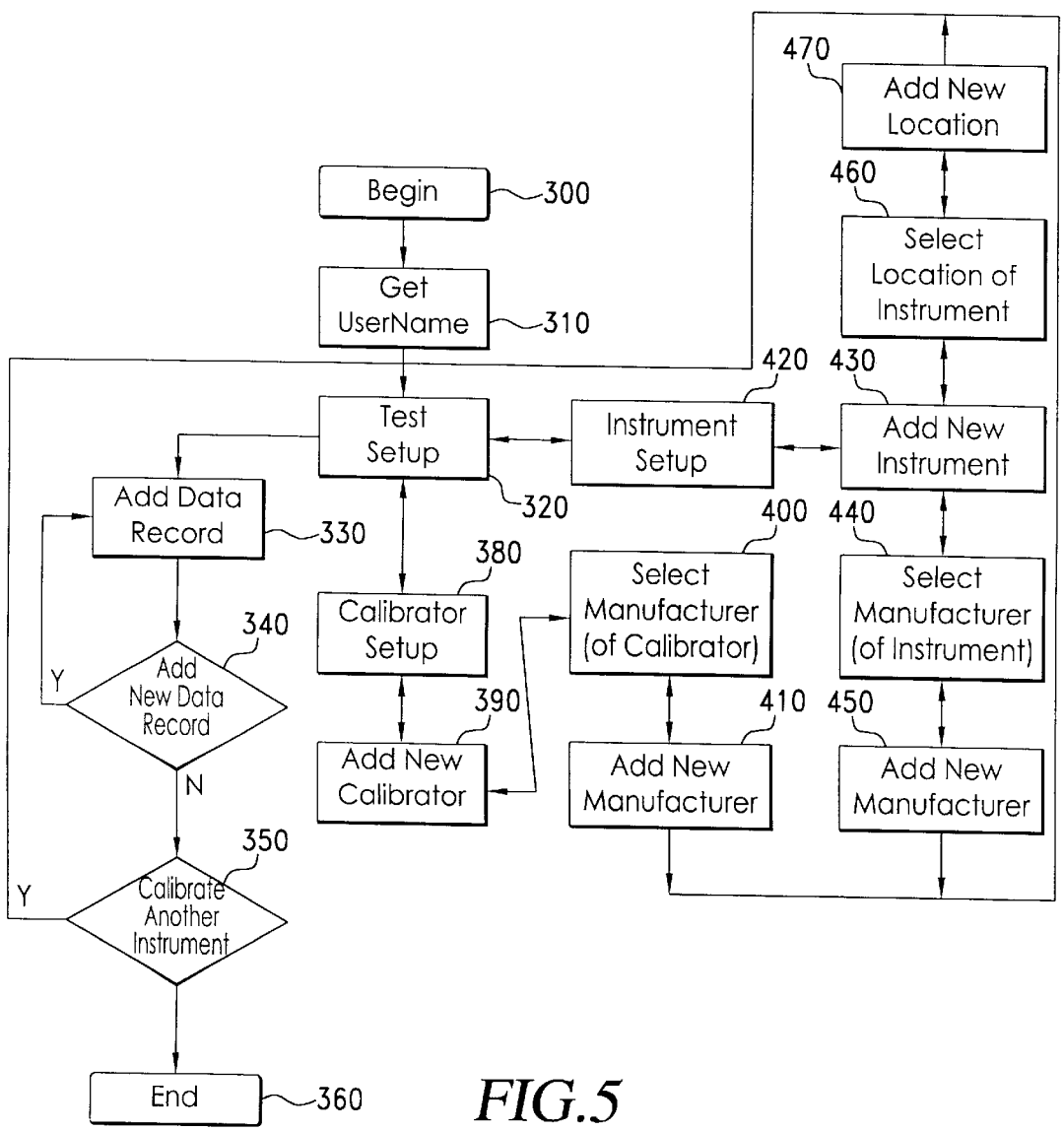
FIG. 5 is a flow chart showing the set up function of the PDA calibrator, which can operate on the PDA or on a host computer.

The PDA software also permits a user to add new calibrators, add data records, and add new instruments. FIG. 5 is a flow chart showing these operations. The program begins at block 300. As shown in block 310, the PDA prompts the user for and gets a user name, which is associated with the subsequent set up. Flow proceeds to block 320, where the user has a choice of adding a data record, calibrator set up and instrument set up. If a data record is added, flow proceeds to block 330 and then to block 340 where data is retrieved from the calibrator base. If data is successfully retrieved, flow reverts to block 330. If no data is received, or if the user elects not to add a new data record, flow proceeds to block 350, where the user is given the choice of calibrating another instrument. If the user elects to calibrate another instrument flow returns to block 320, otherwise the program terminates at block 360.

If the user selects calibrator set up, flow proceeds to block 380. The user may select a calibrator output or elect to add a new calibrator at block 390. If the user elects to add a new calibrator flow proceeds to block 400, where the manufacturer of the calibrator may be selected or, if the appropriate manufacturer does not exist in the data base, a new manufacturer may be added at block 410, whereupon flow reverts to block 320.

If the user selects to set up an instrument, flow proceeds to block 420, where the instrument set up screen is displayed. If the user elects to add a new instrument to the calibration data base, flow proceeds to block 430. The user can either select the manufacturer of a new instrument at block 440, or add a new manufacturer at block 450. After a new manufacturer is added, flow reverts to block 320.

The user may also select an existing location of a new instrument at block 460, or add a new location at block 470, whereupon flow reverts to block 320.

The PDA calibrator in accordance with this invention is preferably used in combination with a calibration data base, preferably a data base operating on a stand alone computer. A plurality of PDA calibrators can be used by calibration technicians to simultaneously calibrate a large number of instruments or process devices.

The calibration software running on the central computer preferably provides the facilities to carry out the entry of instruments, calibration procedures, calibrators and other calibration information in the data base. After the information is entered into the computer, a hot sync or data transfer operation is performed to transfer the information to the PDA.

The PDAs are disconnected from the computer and connected to the calibrator base, and the assembled PDA calibrator is used to calibrate instruments or processes in the field. The results of the calibrations are stored on the PDA, and can be viewed by the calibration technician as necessary.

Once all required calibrations have been completed, the PDA is removed from the calibration base, connected to the computer and a second hot sync operation is performed to transfer the calibration results to the computer, where they are saved in a calibration history table.

FIG. 6 is a list of tables that exist on the PDA (referred to for convenience as PALM, the computer, referred to for convenience as PC, and an indication of whether the data in the table is hot sync or replicated from the PDA to the computer and vice versa.

FIGS. 7 through 17. The calibration history info table includes the same data as the calibration results table and in addition, each record has an auto number key. Whenever there is an index reference, the record will be related to the referenced record, for example the instrument index plus all the fields in the instrument table, etc.

Similarly, the calibration history data table includes the same data as the calibration results table, plus an auto number key for each reference. Whenever there is an index reference, the record will be related to the referenced record.

Figure 18:
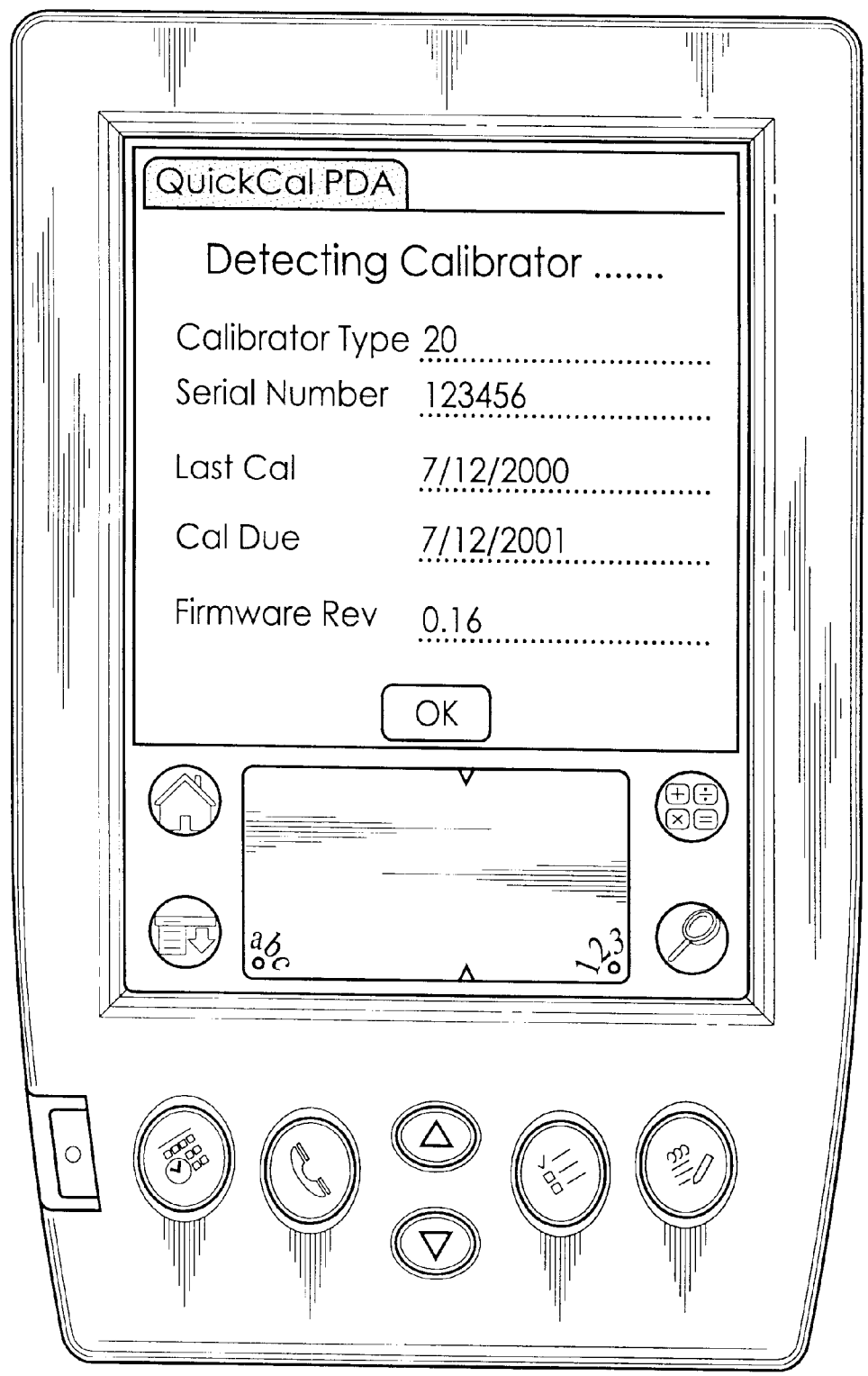
FIG. 18 is a drawing of the screen display showing the calibrator information detecting step.

FIG. 18 shows the display of the PDA when presenting information to the user after carrying out the steps set forth in block 210 of FIG. 4. The display indicates the calibrator type the serial number of the calibrator the date the calibrator was last calibrated, the date the calibrator is due for calibration and the firm ware revision of the calibrator.

Figure 19:
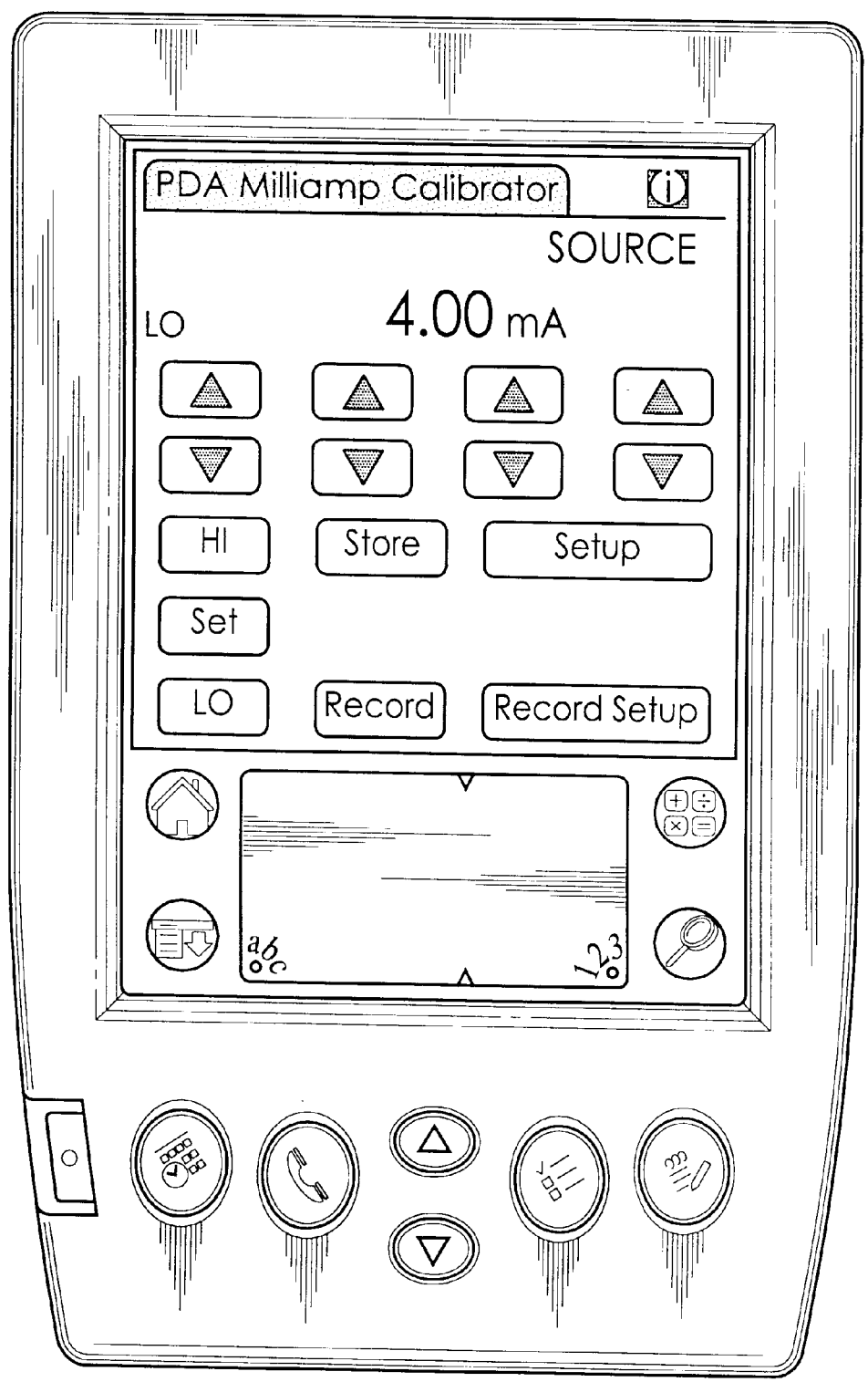
FIG. 19 is a copy of the screen display showing the low value sourcing operation.
Figure 20:
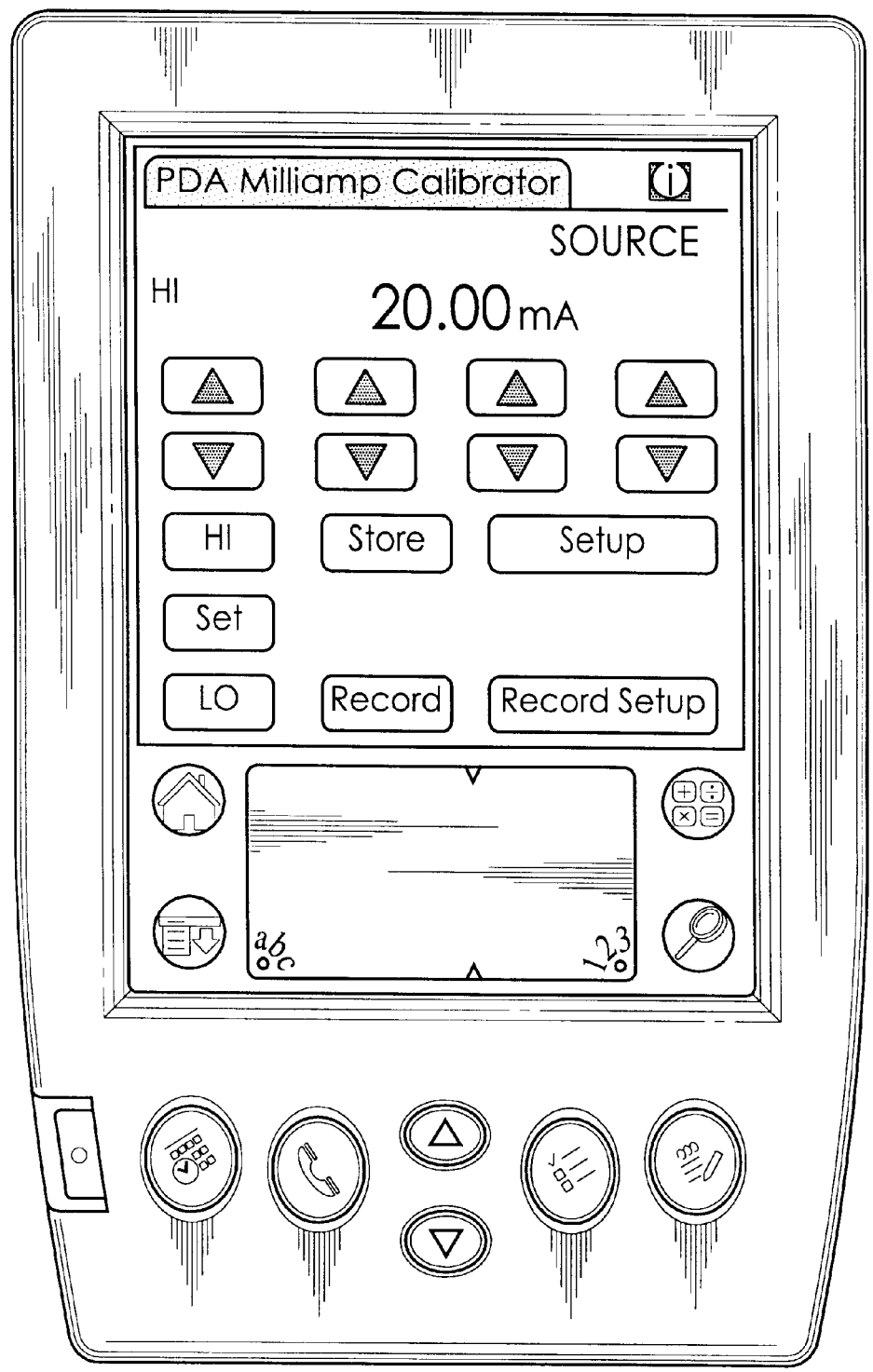
FIG. 20 is drawing of the screen display showing a high value sourcing operation.
Figure 21:
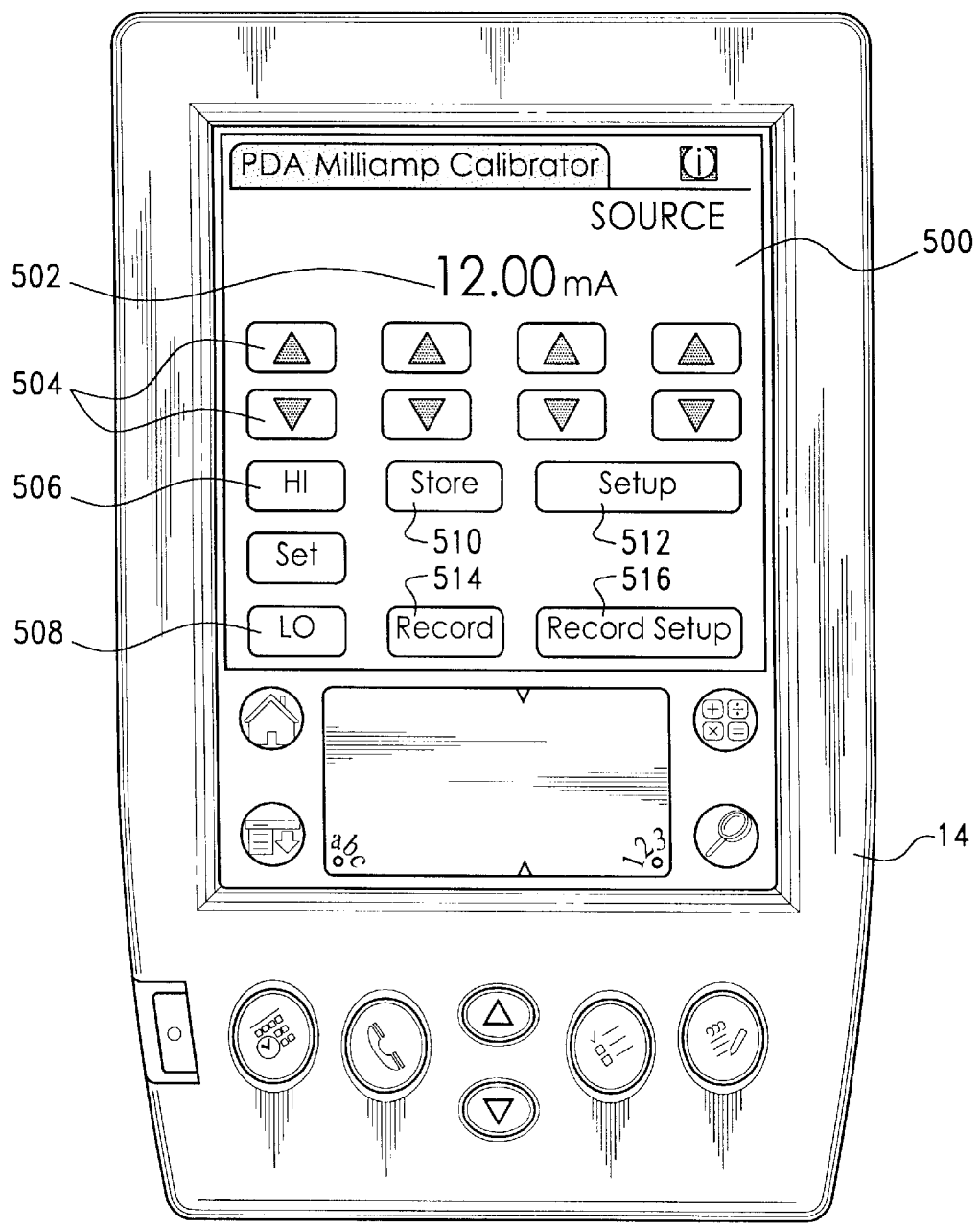
FIG. 21 is a diagram of the screen display showing the variable value sourcing operation.

FIGS. 19 through 21 show the calibrator acting as a milliamp card source. FIG. 19 shows the PDA calibrator providing a 4.00 milliamp low signal to an instrument or device.

FIG. 20 shows the PDA calibrator providing a 20.00 milliamp (high) signal to an instrument or process device and FIG. 21 shows the PDA calibrator providing a 12.00 milliamp intermediate level to an instrument or process device.

Referring to FIG. 21 the touch screen 501 of PDA 14 includes a number of graphical user interface elements. The magnitude of the source current is indicated numerically at 502 as a four digit number to two decimal places. Four sets of up/down graphical buttons 504 allow the user to adjust the current by modifying each of the four digits displayed.

For convenience, HI button 506 sets the source to the 20 milliamp high level and LO button 508 sets the milliamp source to a 4.00 milliamp low level.

The graphical user interface also includes a store button 511, a set up button 512, a record button 514, and a record set up button 516.

Figure 22:
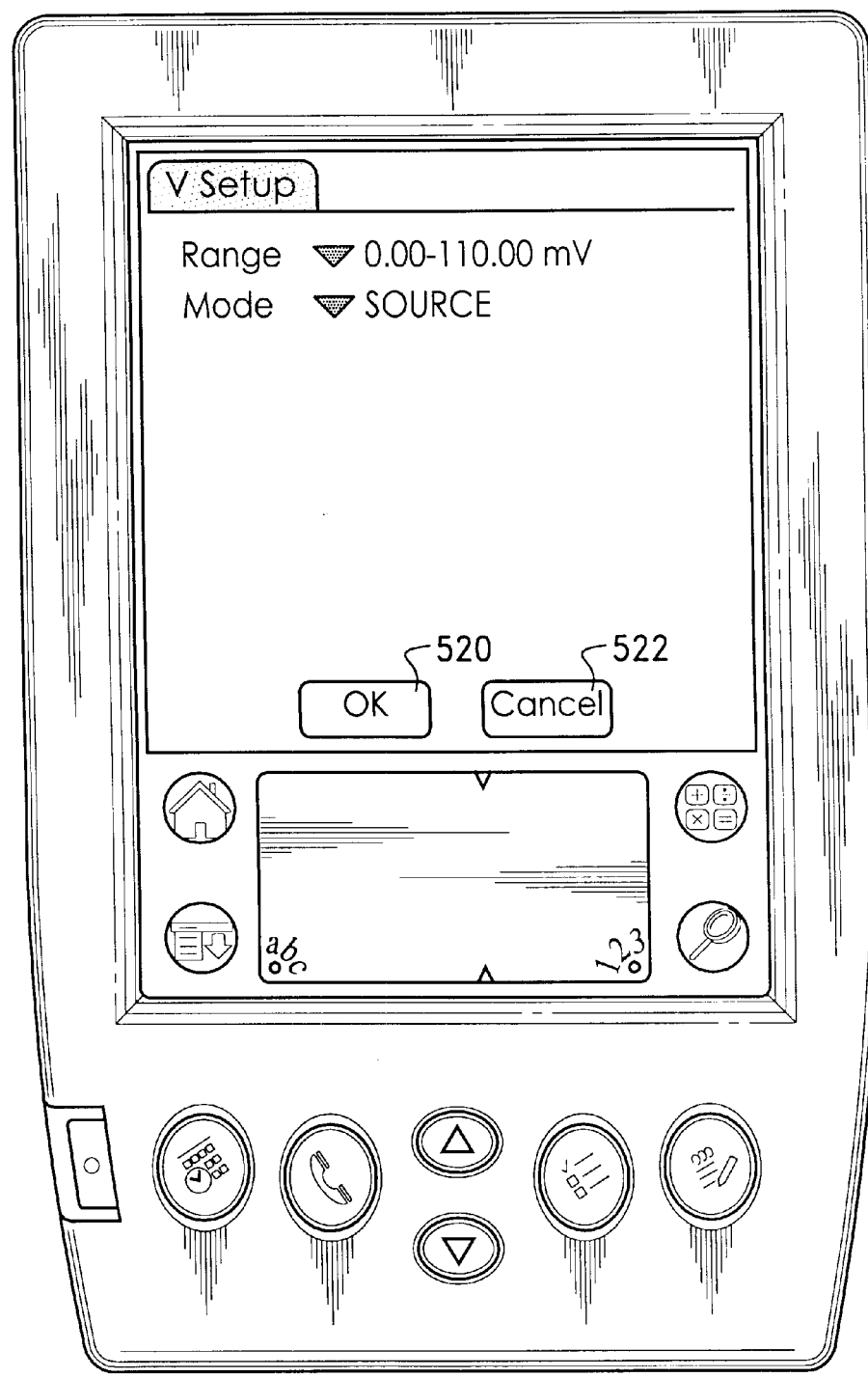
FIG. 22 is a drawing of the screen display showing the voltage set up function.

FIG. 22 shows the user interface for the voltage set up function. The screen permits the user to set the range of voltages and the mode of the PDA calibrator. Each of the range and mode selections is accessible through a drop down menu. Once the desired range and mode have been sent, the user presses the virtual button 521 to save the selection, or cancel button 522 to cancel the change.

Figure 23:
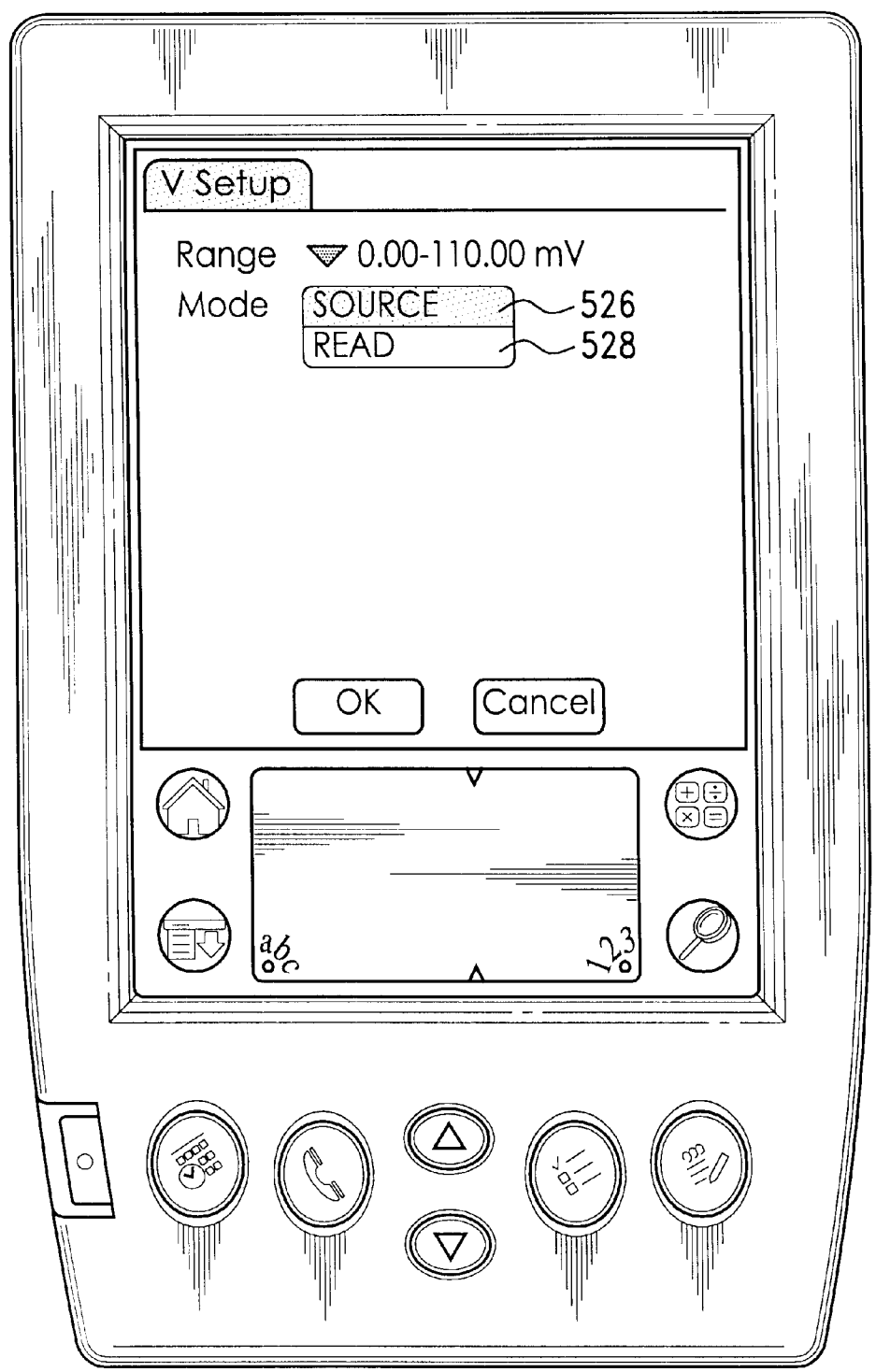
FIG. 23 is a drawing of the screen display showing the mode selection operation of the voltage set up procedure.
Figure 24:
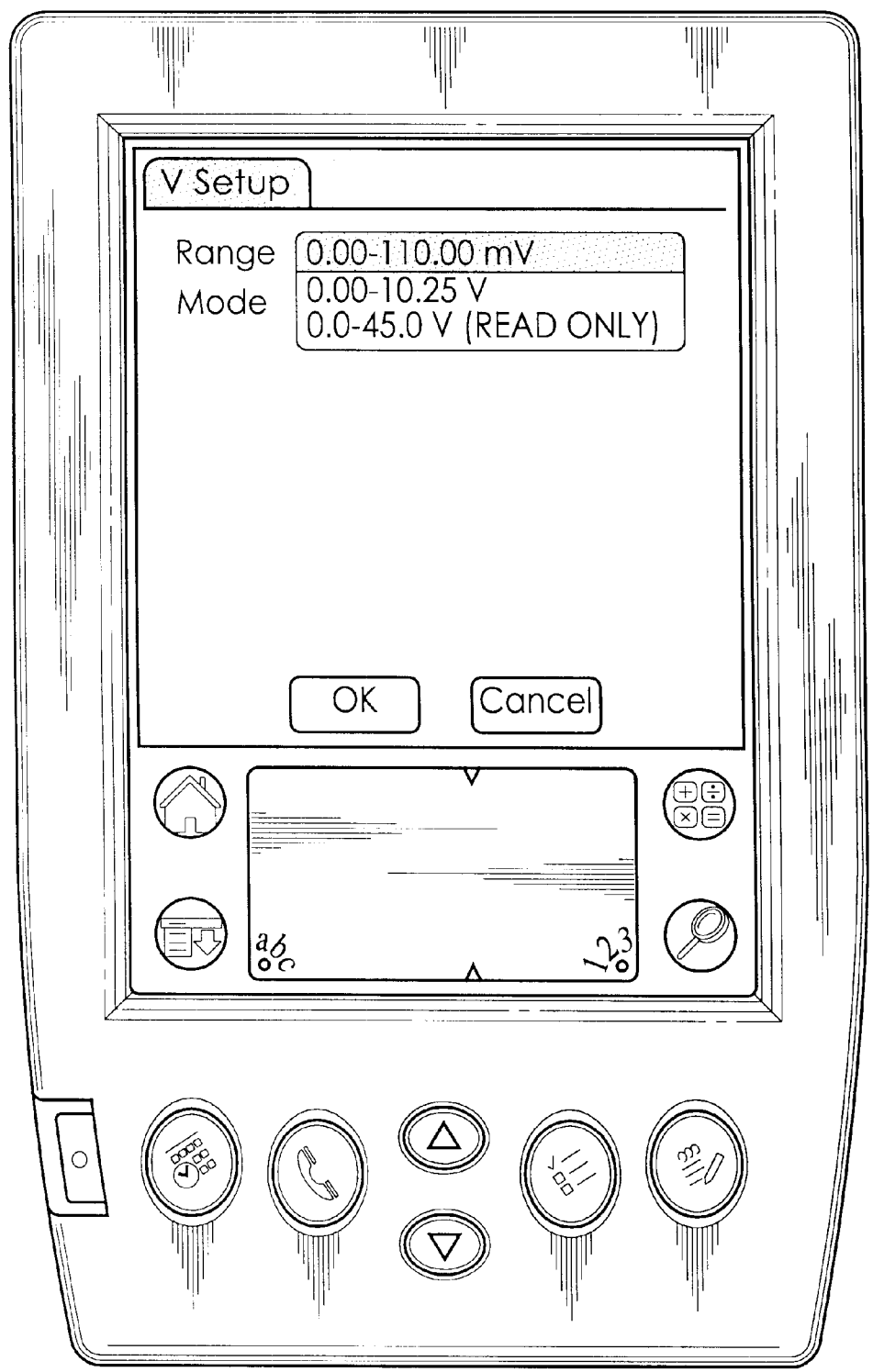
FIG. 24 is a drawing showing the screen display of the range set up operation of the voltage set up procedure.

FIG. 23 shows the mode drop down menu from which the source mode 526 or the read mode 528 can be selected. FIG. 24 shows the drop down range selection menu from which the following ranges can be selected:

0.00–110.00 mV, 0.00–10.25V and 0.0–45.0V (read only). The okay and cancel buttons act as already described.

Figure 25:
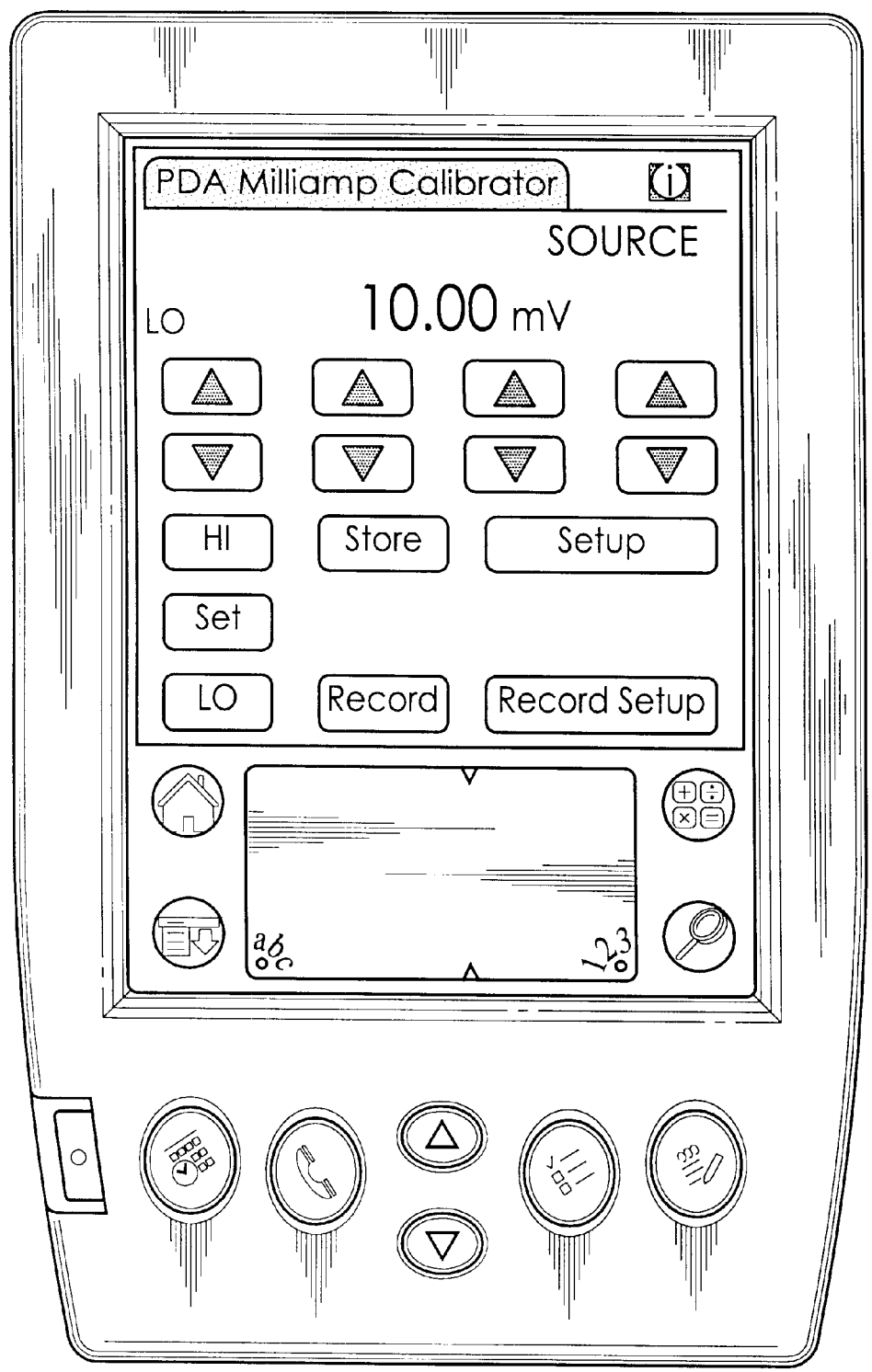
FIG. 25 is a drawing showing the screen display of the low voltage sourcing procedure.
Figure 26:
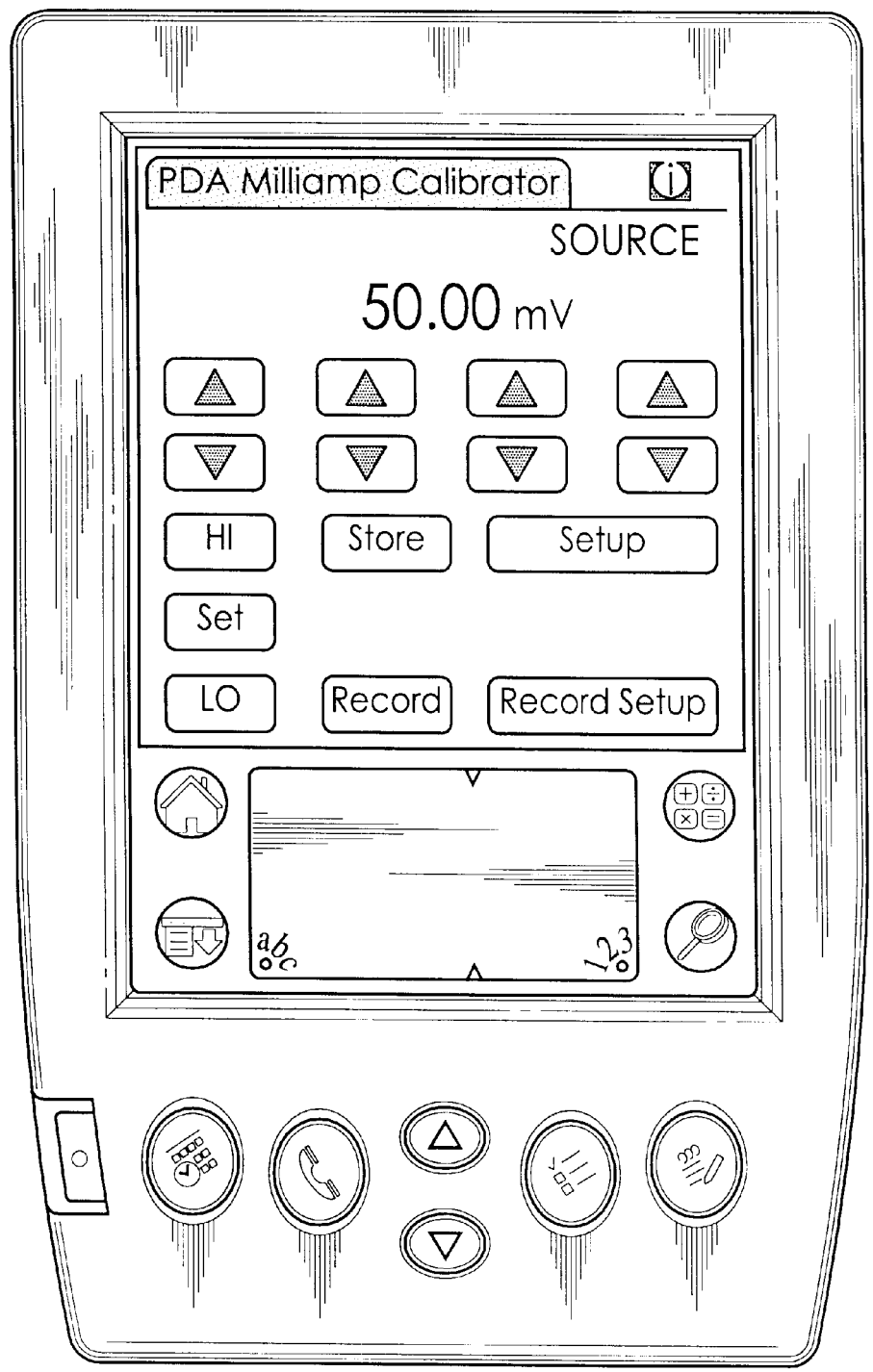
FIG. 26 is a screen display showing the variable voltage sourcing procedure.
Figure 27:
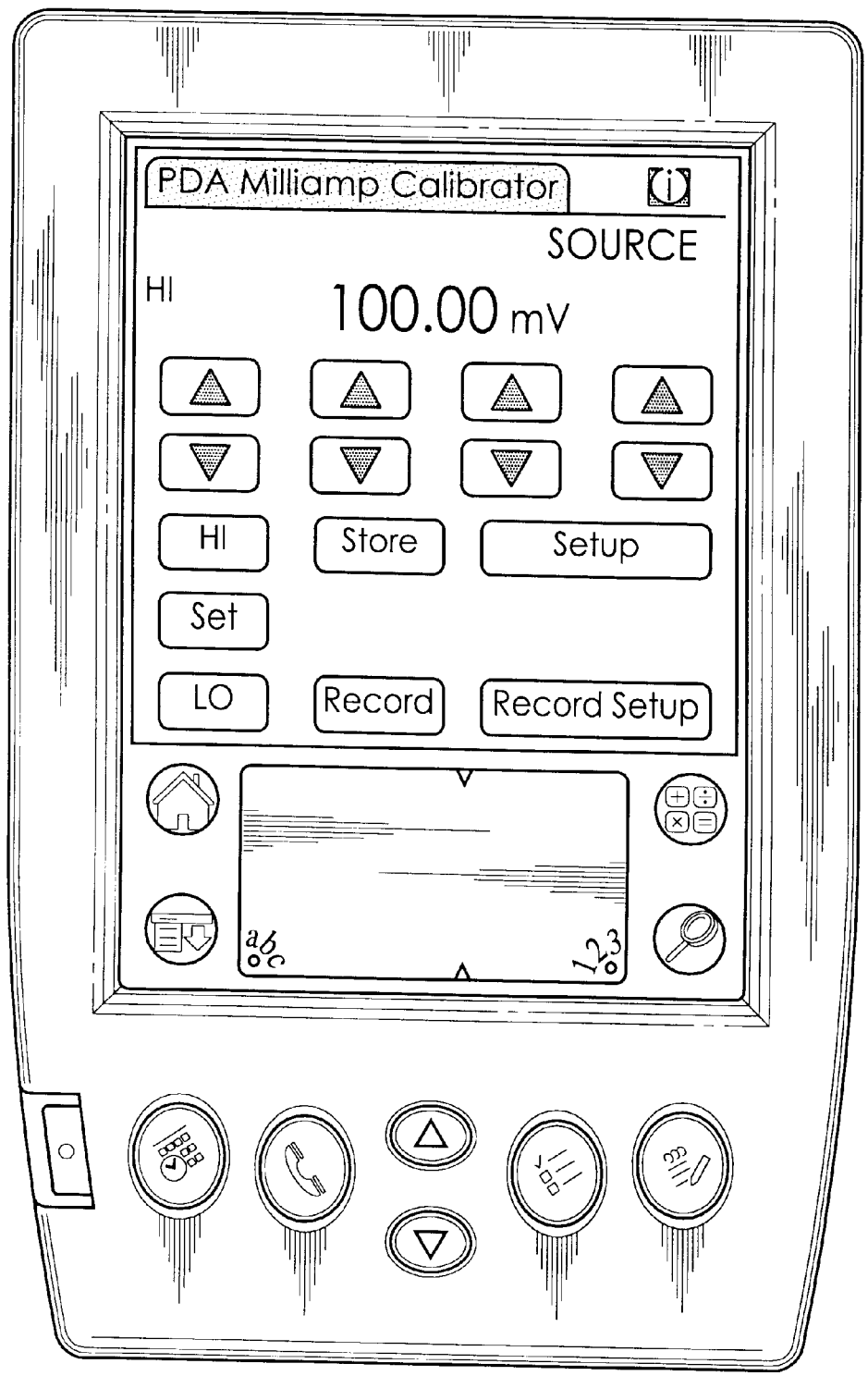
FIG. 27 is a screen display of the high voltage sourcing procedure.

FIGS. 25–27 show the PDA calibrator acting as a voltage source, providing a 10–100 mV calibration signal. The voltage source operation of the PDA calibrator is substantially identical to the operation of the calibrator of the current source as already described in connection with FIGS. 19–21.

Figure 28:
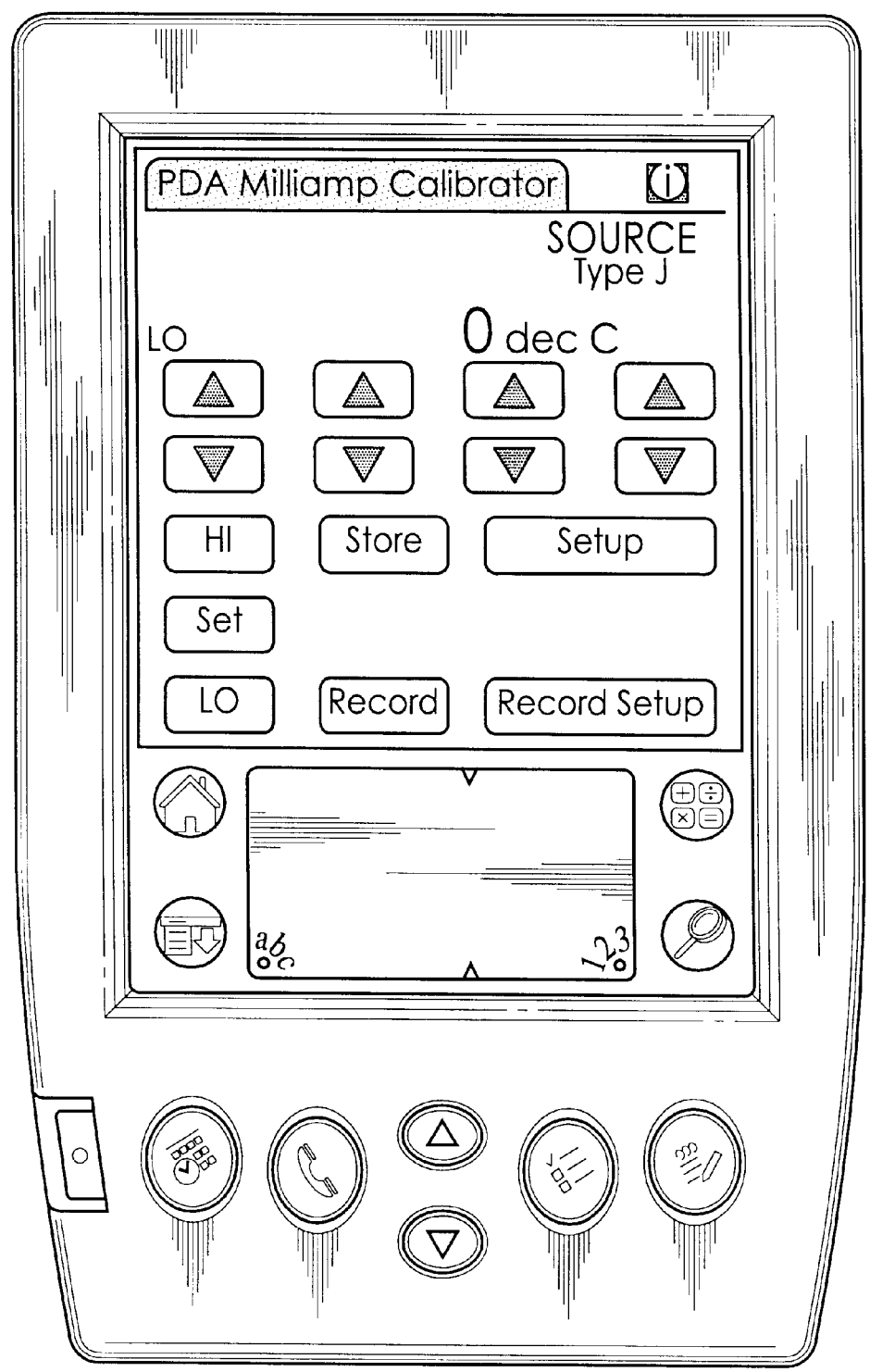
FIG. 28 is a screen display showing the low value type J thermo couple sourcing procedure.
Figure 29:
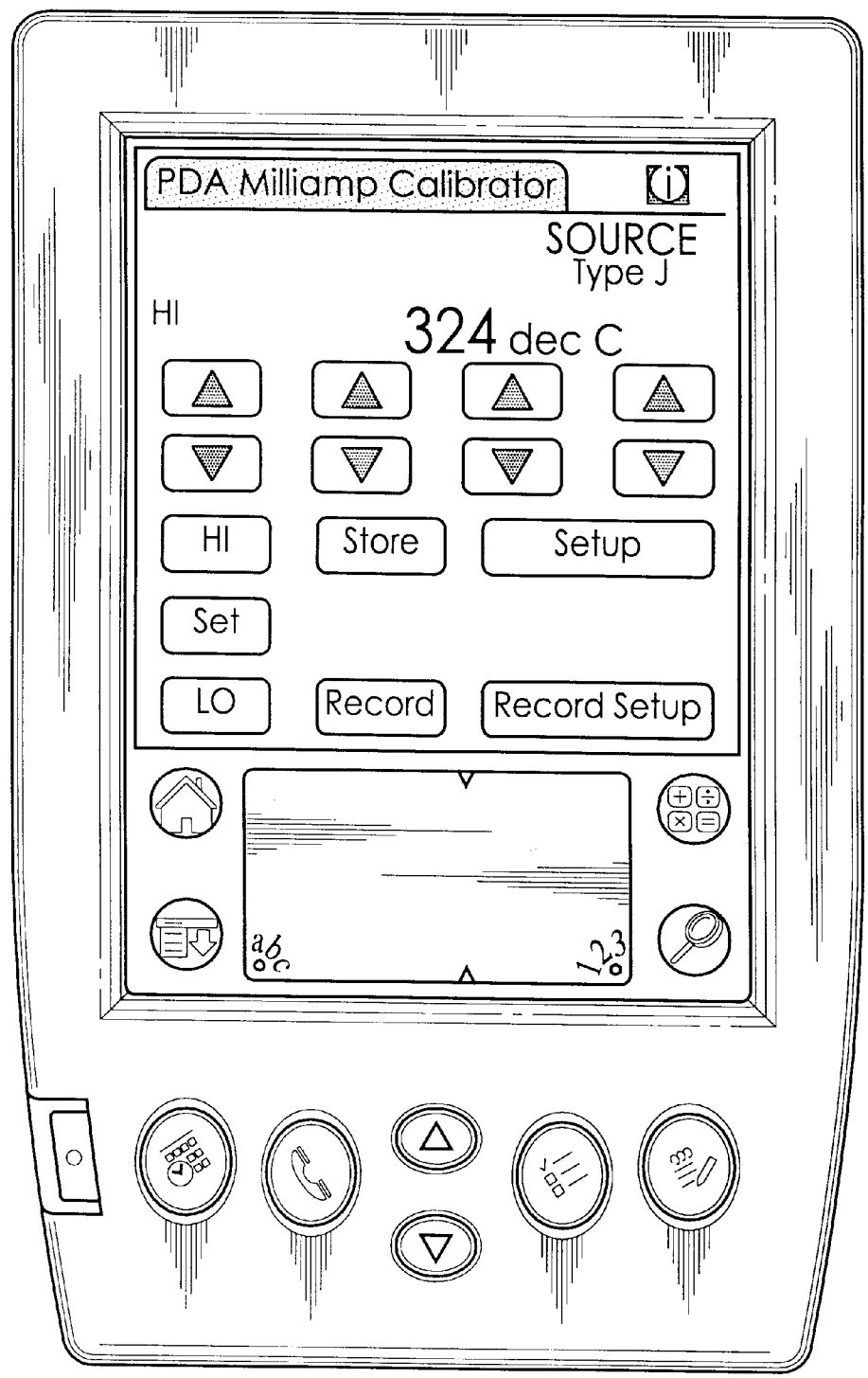
FIG. 29 is a screen display showing the high value J type thermo couple sourcing procedure.
Figure 30:
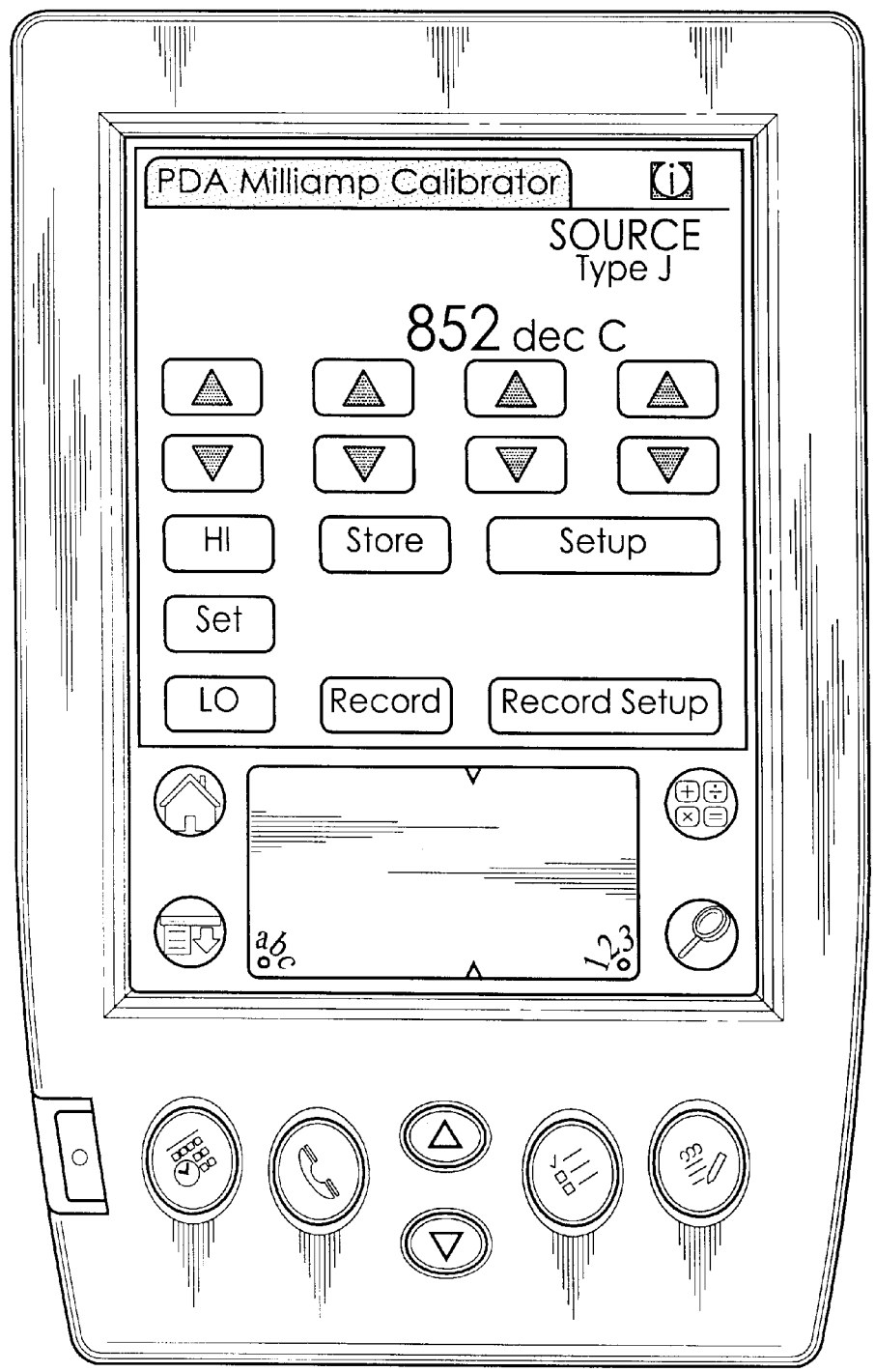
FIG. 30 is a drawing showing the screen display of the variable type J thermo couple sourcing procedure.

FIGS. 28–30 show the PDA calibrator acting as a thermo couple source. The operation of the calibrator in the thermo couple source mode is substantially identical to the current and temperature modes as already described, except that the maximum and minimum values are –013.6 degrees F. min and 486.0 degrees F. max.

Figure 31:
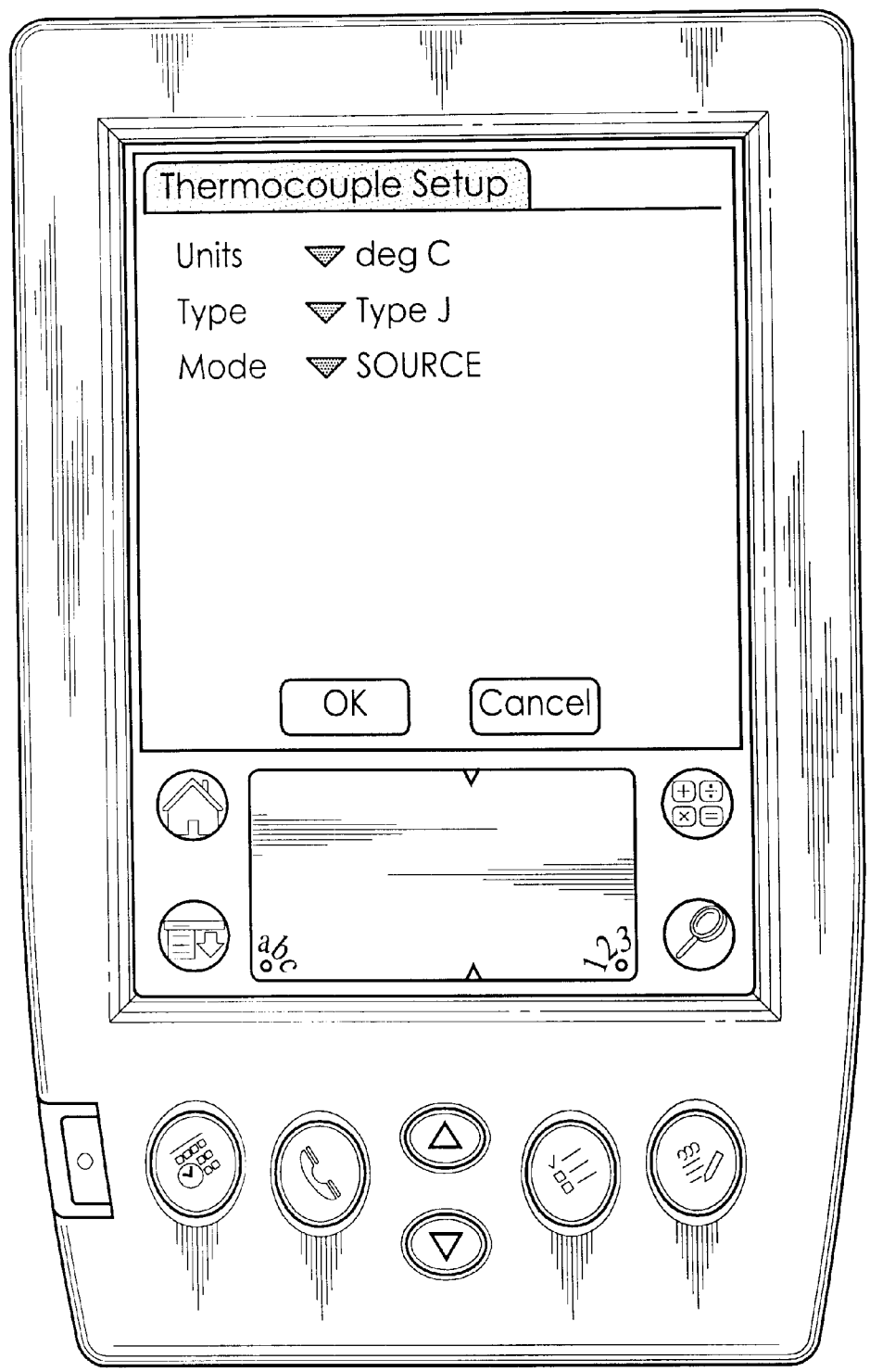
FIG. 31 is a drawing showing the thermo couple set up screen display.
Figure 32:
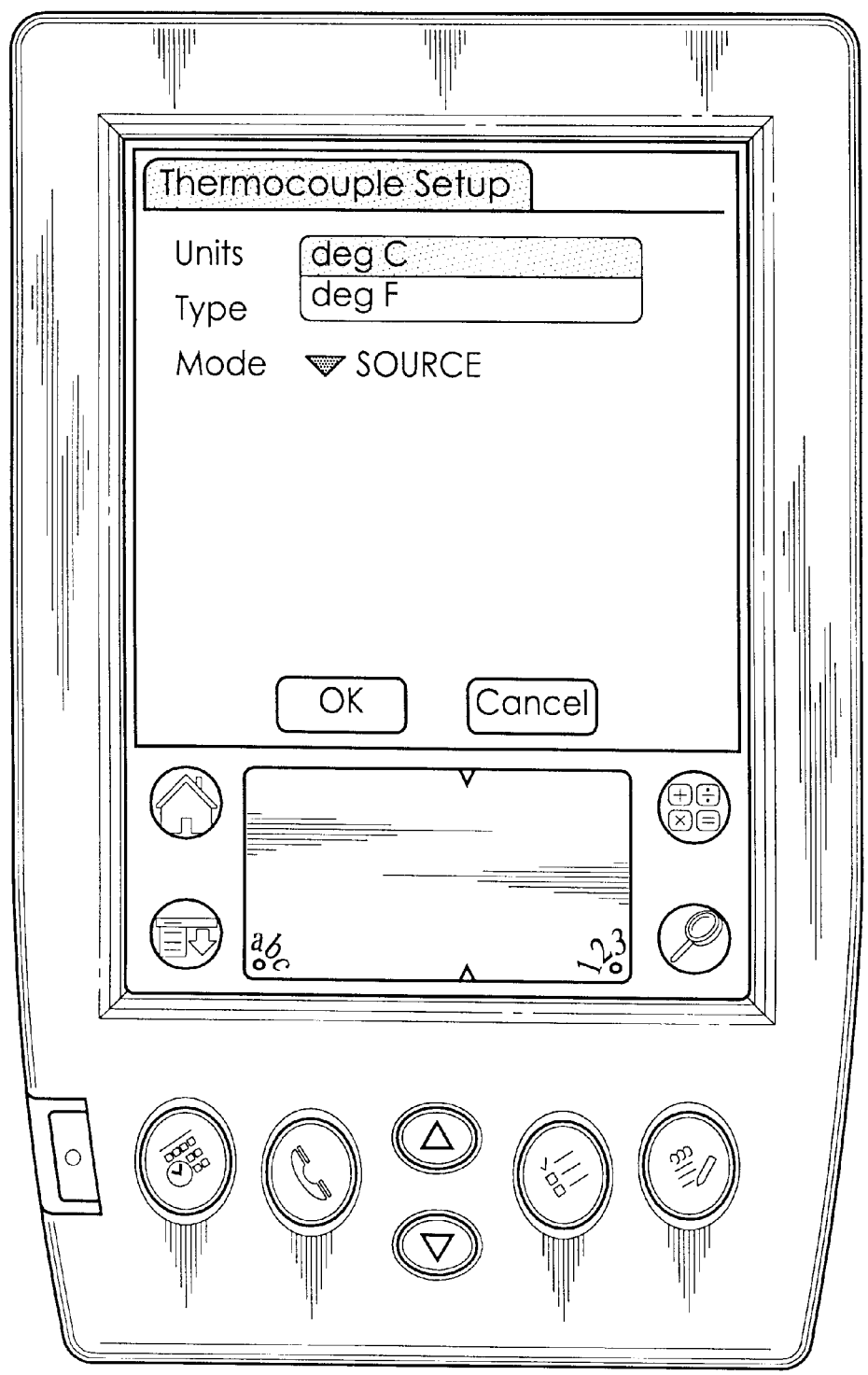
FIG. 32 is a drawing showing the selection of units in the thermo couple set up procedure.
Figure 33:
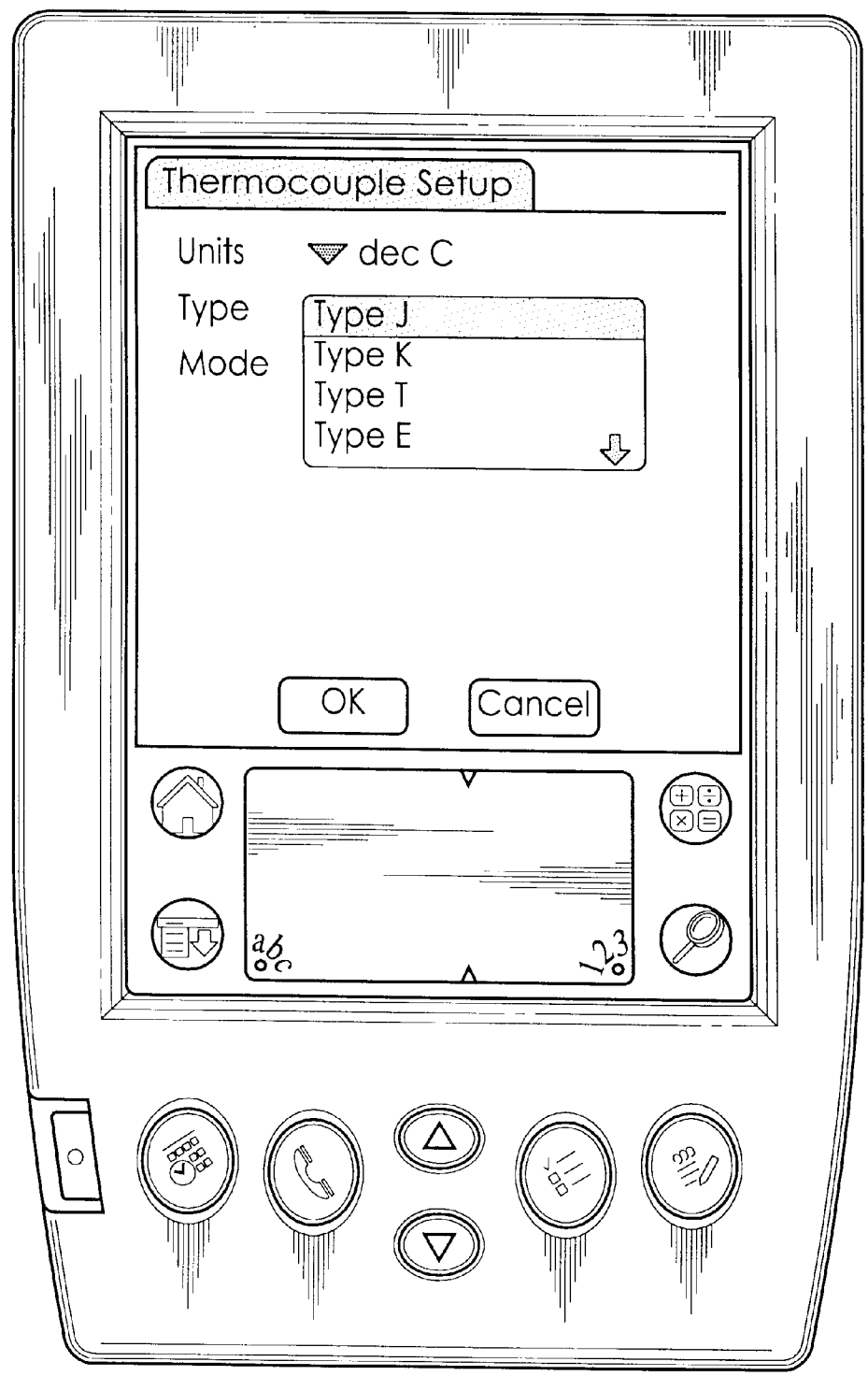
FIG. 33 is a drawing of the screen display showing the selection of thermo couple type in the thermo couple set up procedure.
Figure 34:
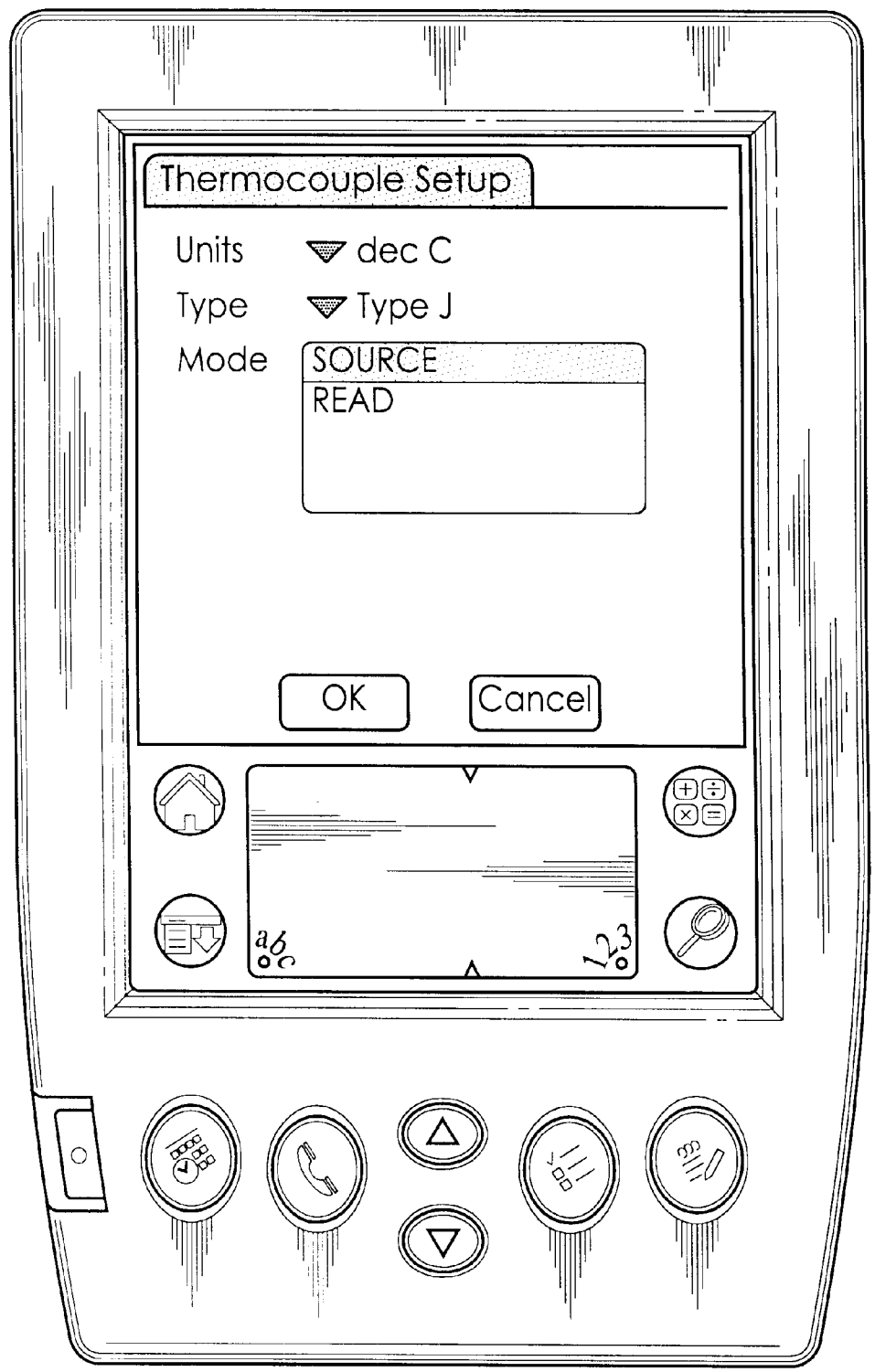
FIG. 34 is a drawing of the screen display showing the mode selection portion of the thermo couple set up procedure.

FIGS. 31 through 34 show the thermo couple set up mode of the PDA calibrator. As shown in FIG. 31, the set up mode allows the units, thermo couple type, and mode, to be set using drop down menus. As shown in FIG. 32, the units can be set to degrees Centigrade or degrees Fahrenheit by selecting the appropriate menu items. As shown in FIG. 33, the thermo couple type can be set to type J, type K, type T, and type, E, selecting the appropriate menu item. As shown in FIG. 34, the mode can be set to the source mode or the read mode as desired by selecting the appropriate menu item. Okay and cancel virtual buttons act in the same way as already described.

Figure 35:
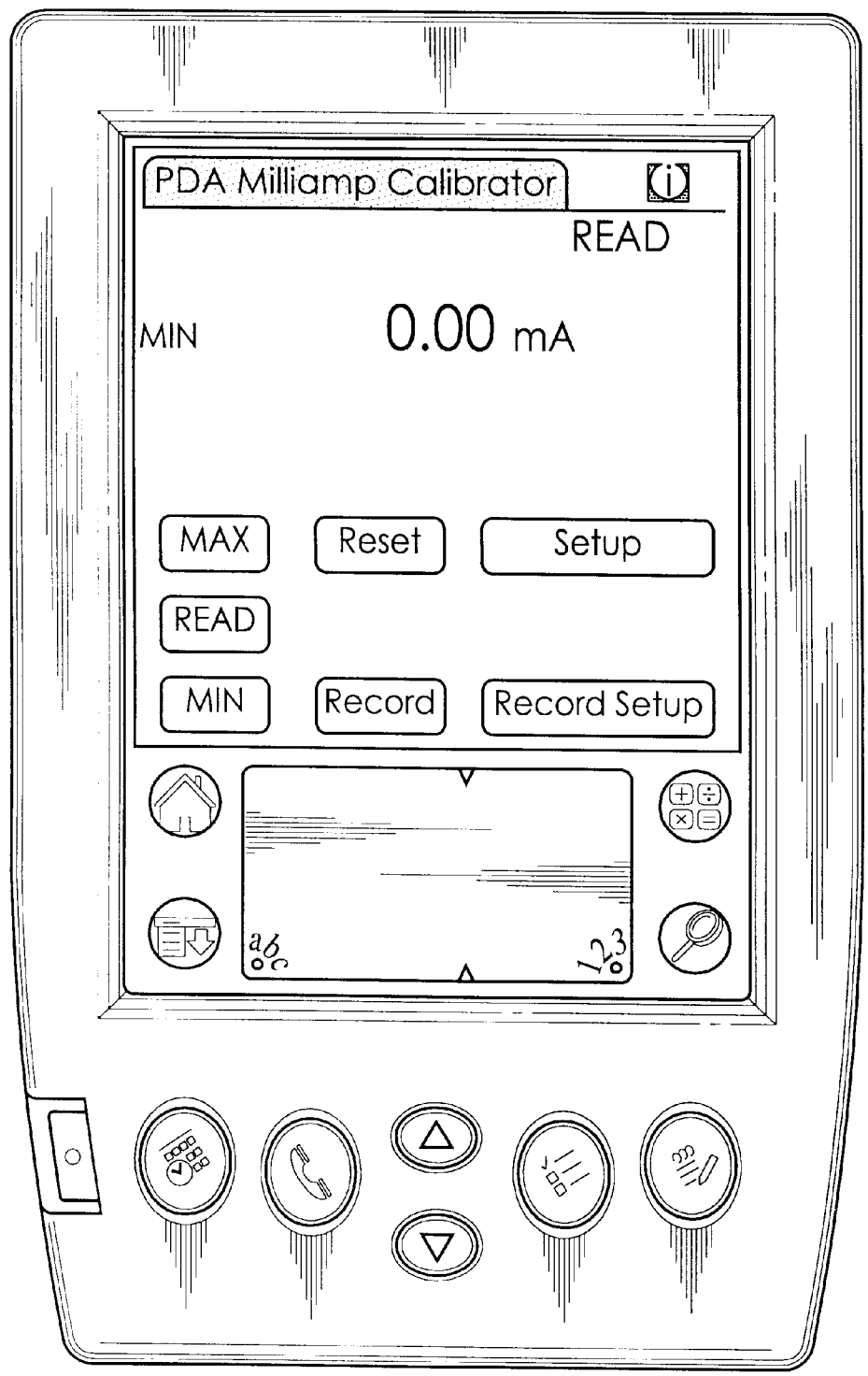
FIG. 35 is a drawing showing the screen display of the minimum current read function.
Figure 36:
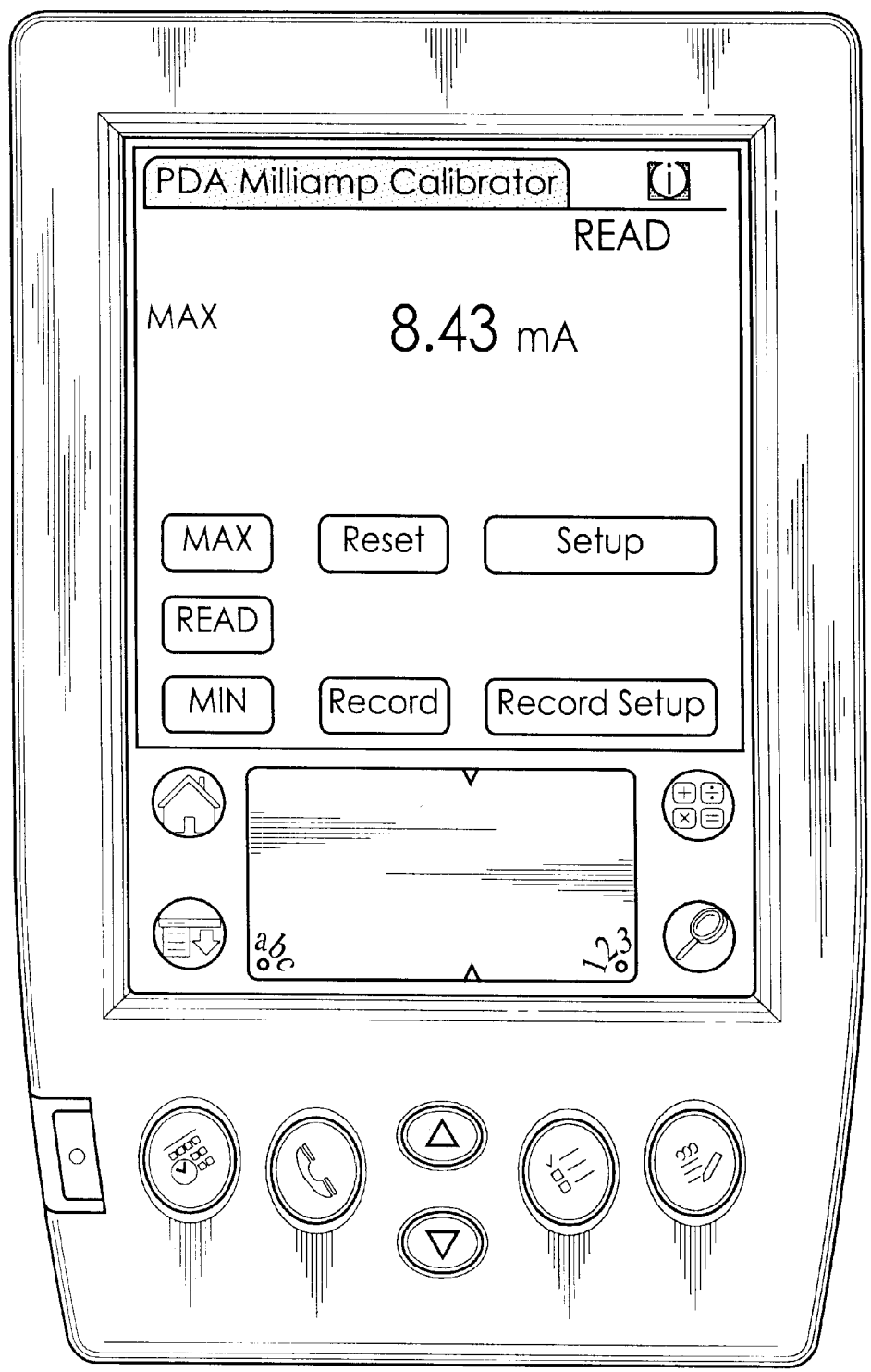
FIG. 36 is a drawing slowing the screen display of the maximum current read function.
Figure 37:
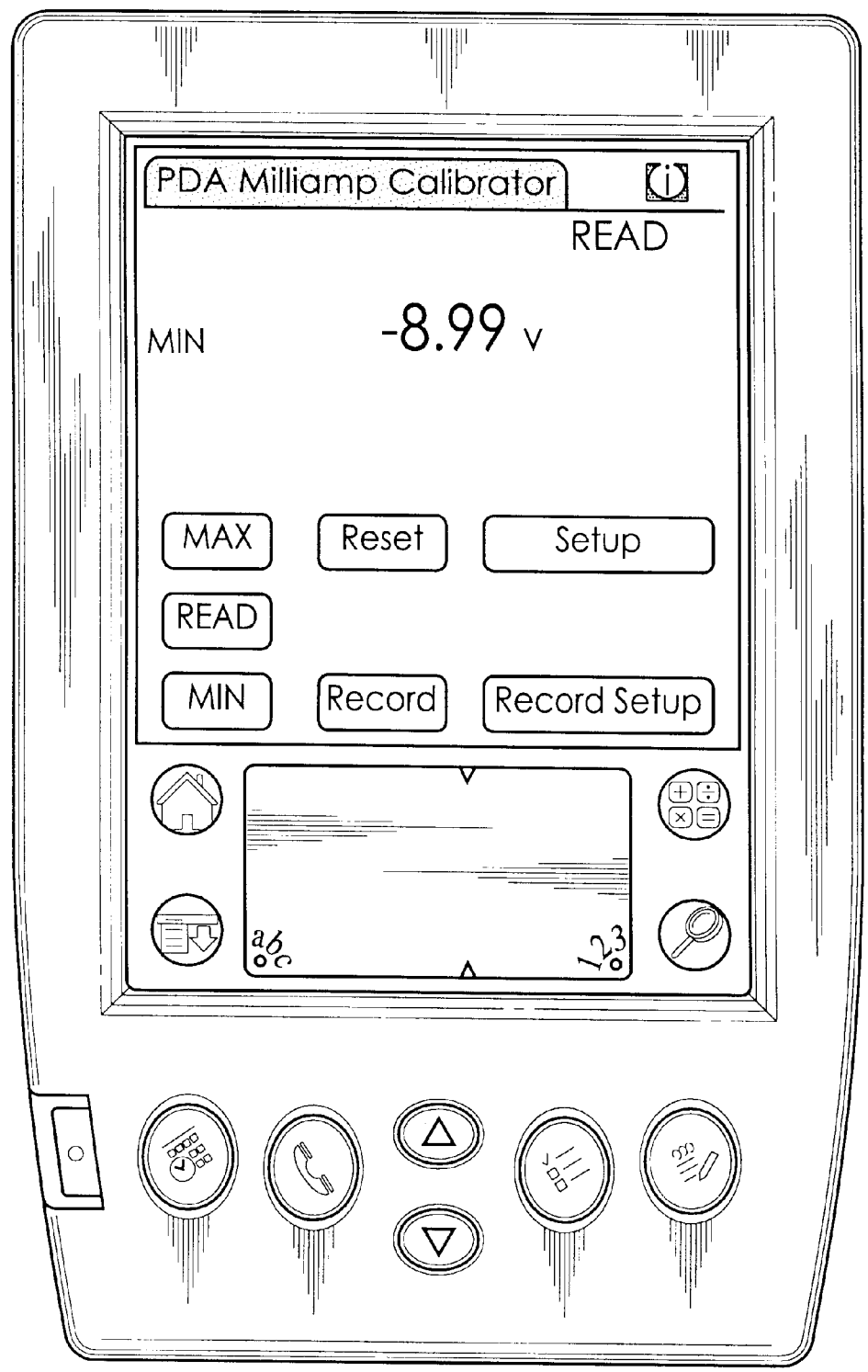
FIG. 37 is a drawing showing the screen display of the minimum voltage read function.
Figure 38:
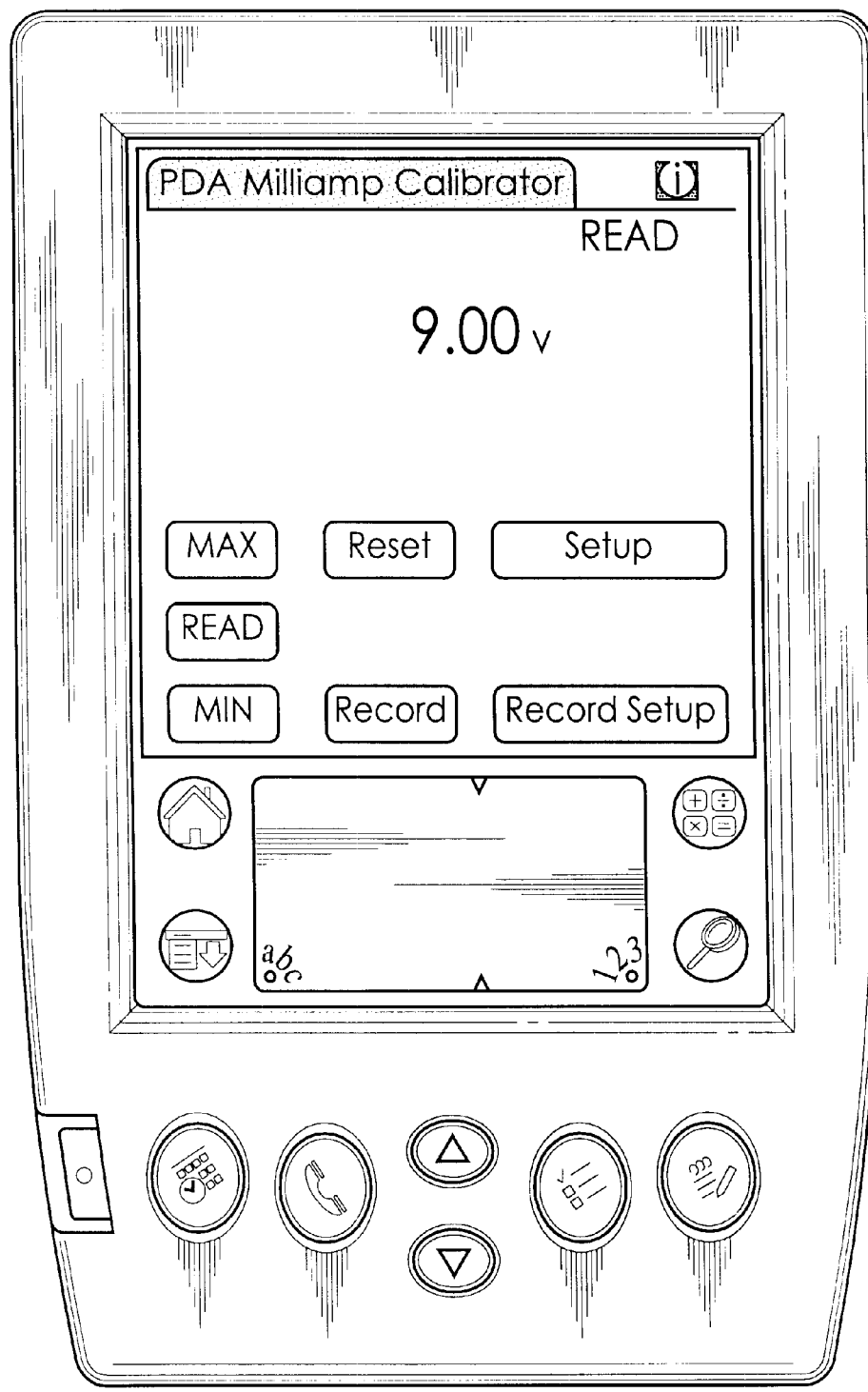
FIG. 38 is a drawing showing the screen display of the variable voltage read function.
Figure 39:
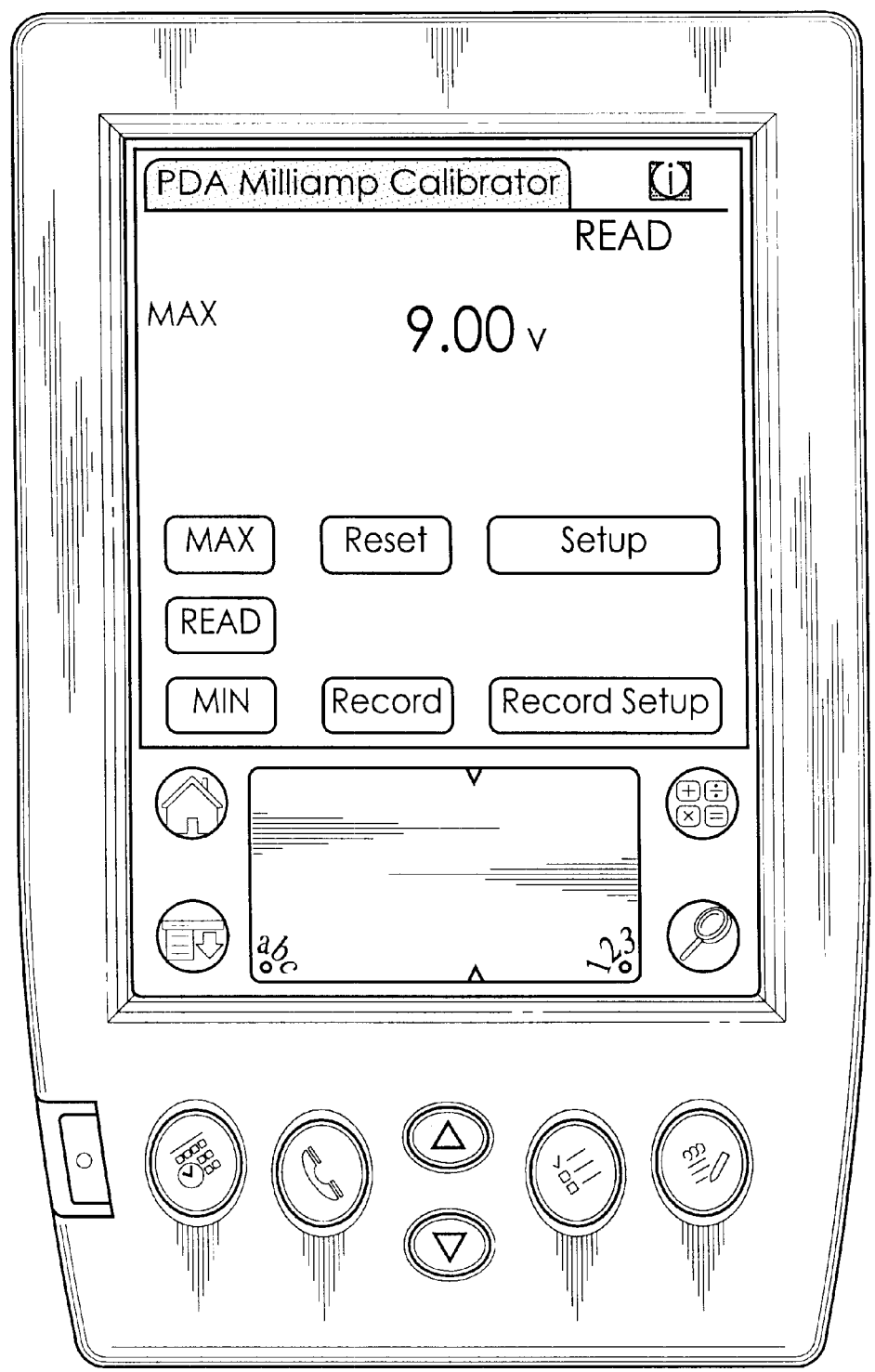
FIG. 39 is a drawing showing the screen display of the maximum voltage screen function.
Figure 40:
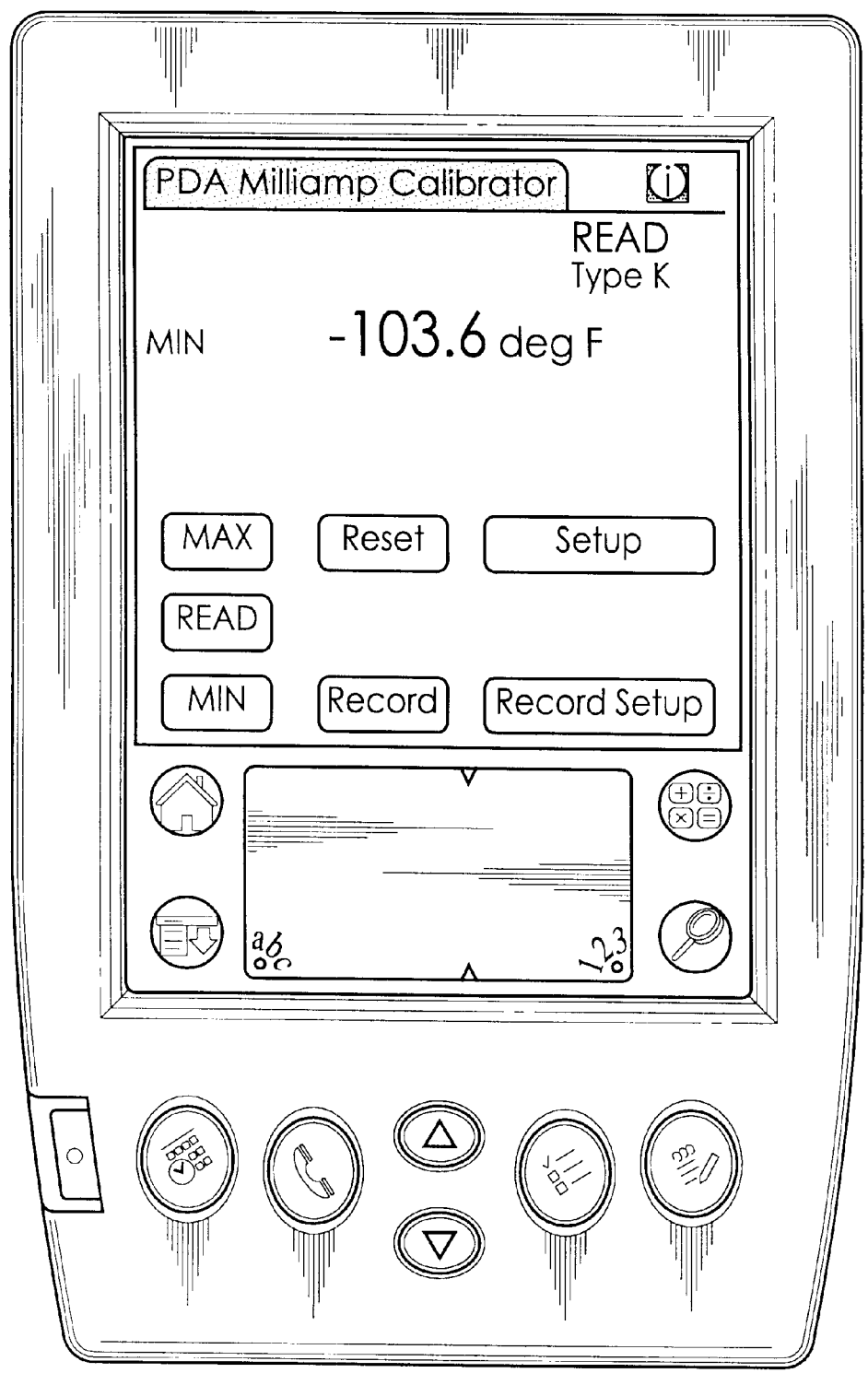
FIG. 40 is a drawing showing the screen display of the K type thermo couple minimum value read function.
Figure 41:
FIG. 41 is a drawing showing the screen display of the K type thermo couple variable temperature read function.
Figure 42:
FIG. 42 is a drawing showing the screen display of the K type thermo couple maximum temperature read function.

FIGS. 35 through 42 show various read mode displays. FIGS. 35 and 36 show the minimum and maximum milliamp read modes, FIGS. 37–39 shown the minimum, nominal and maximum voltage read mode displays, and FIGS. 40–42 show the minimum, nominal and maximum type K thermo couple read mode displays.

Figure 43:
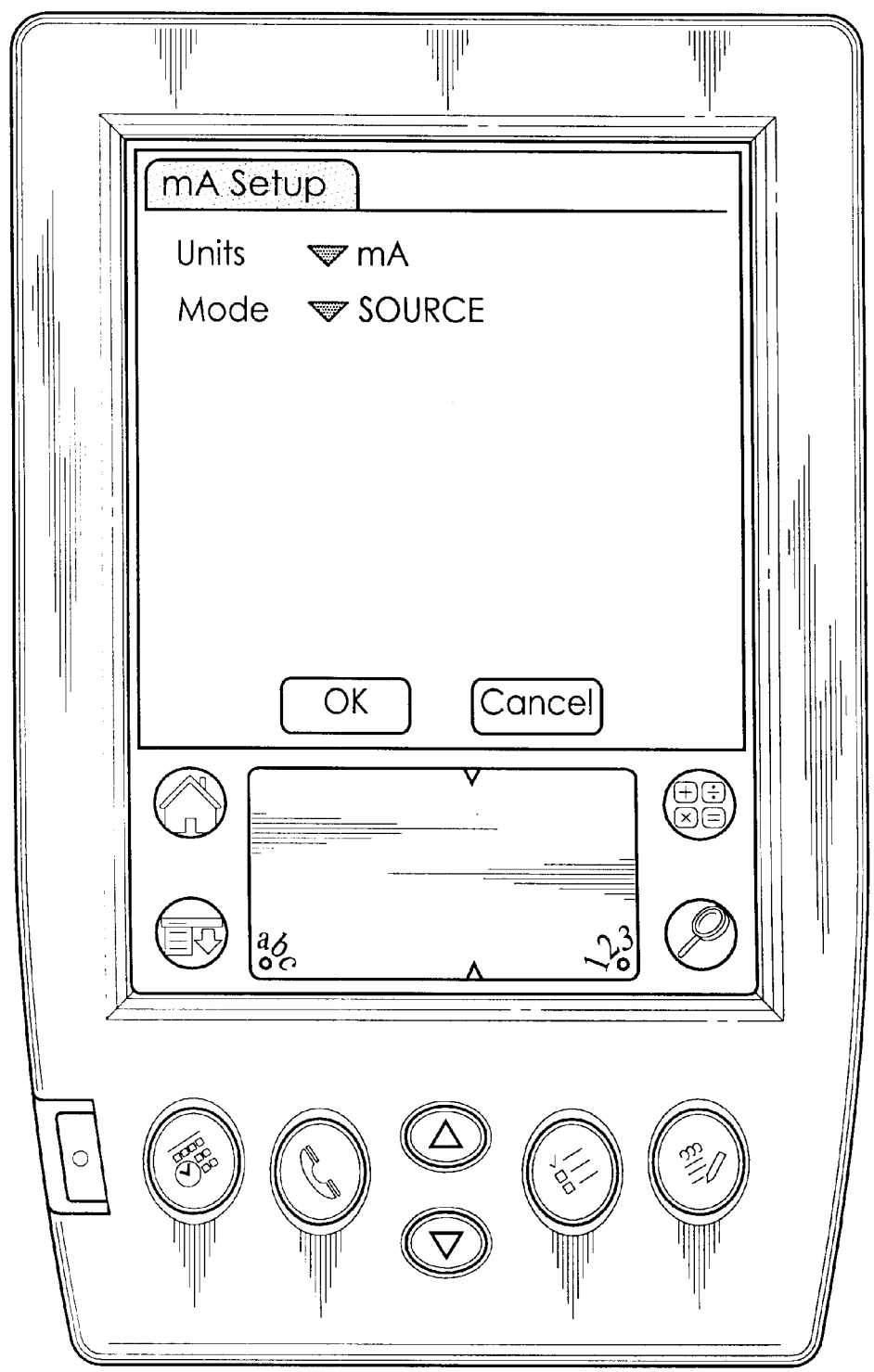
FIG. 43 is a drawing showing the screen display of the milliamp current set up function.
Figure 44:
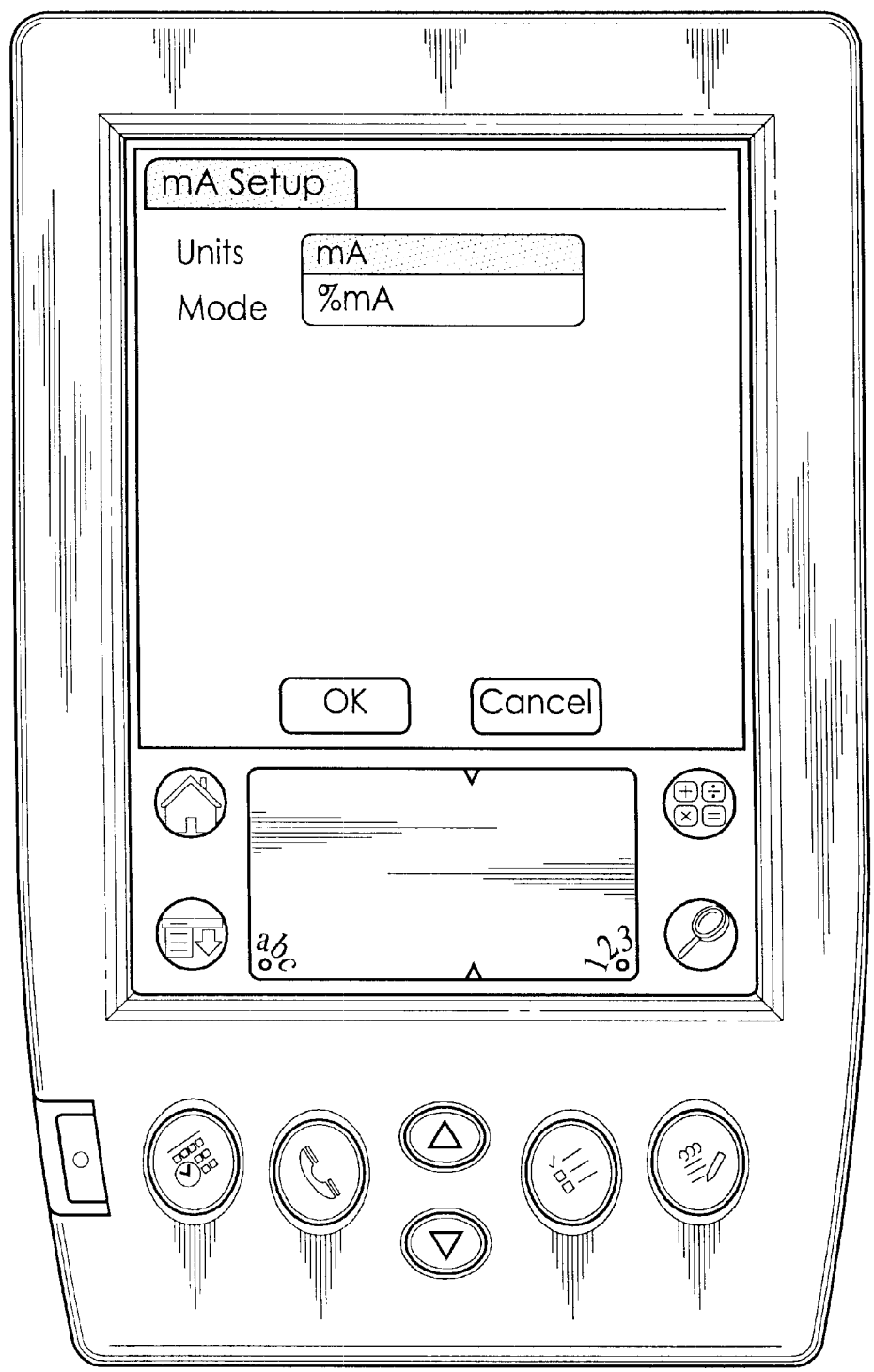
FIG. 44 is a drawing showing the selection of units in the milliamp set up procedure.
Figure 45:
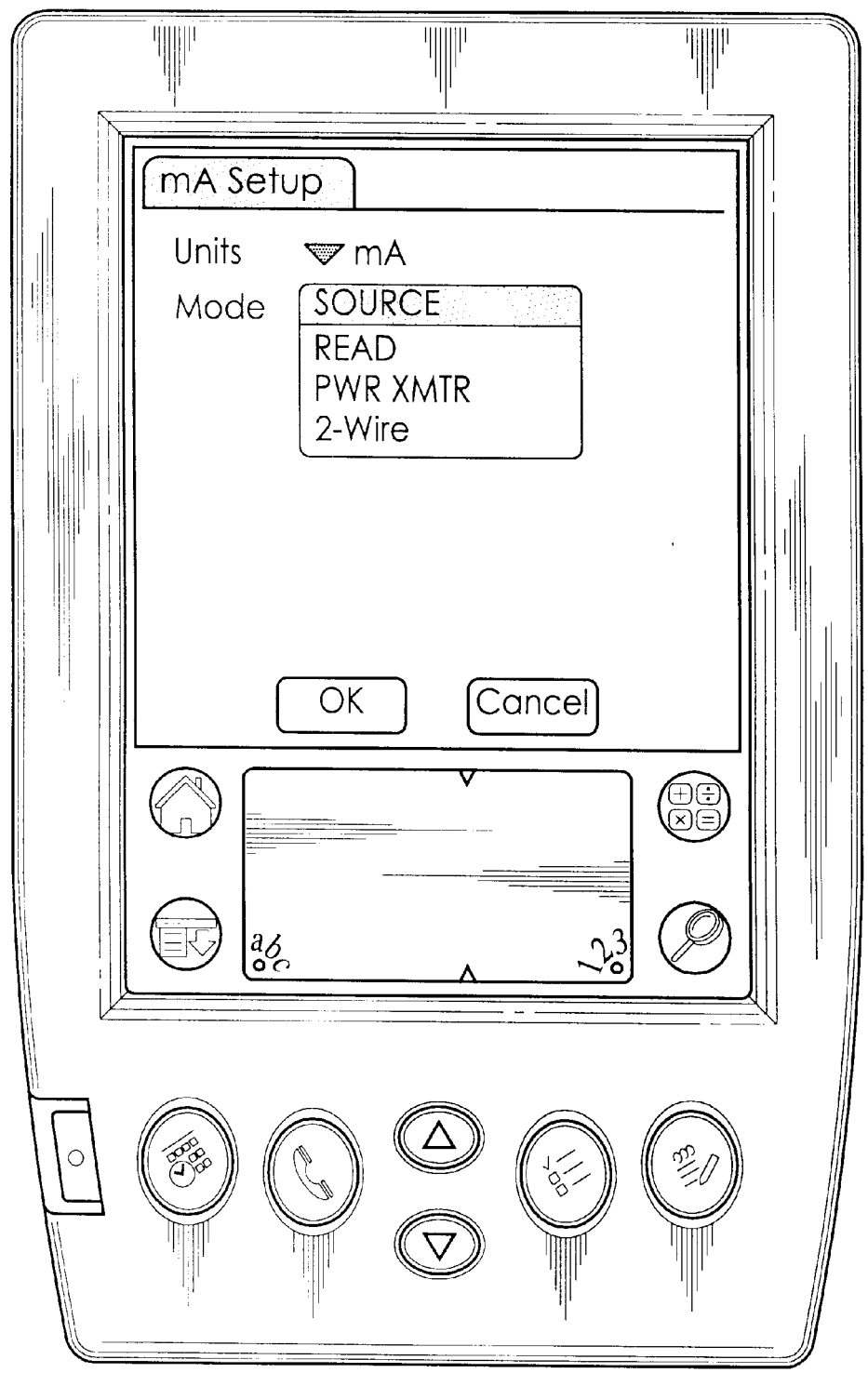
FIG. 45 is a drawing of the screen display showing the mode selection portion of the milliamp set up procedure.

The current set up screen display is shown in FIG. 43. This screen allows the units and the mode to be set. FIG. 44 shows the selection of the milliamp mode or the per cent milliamp mode and FIG. 45 shows the selection of the source, read, power transmitter and 2-wire modes.

Figure 46:
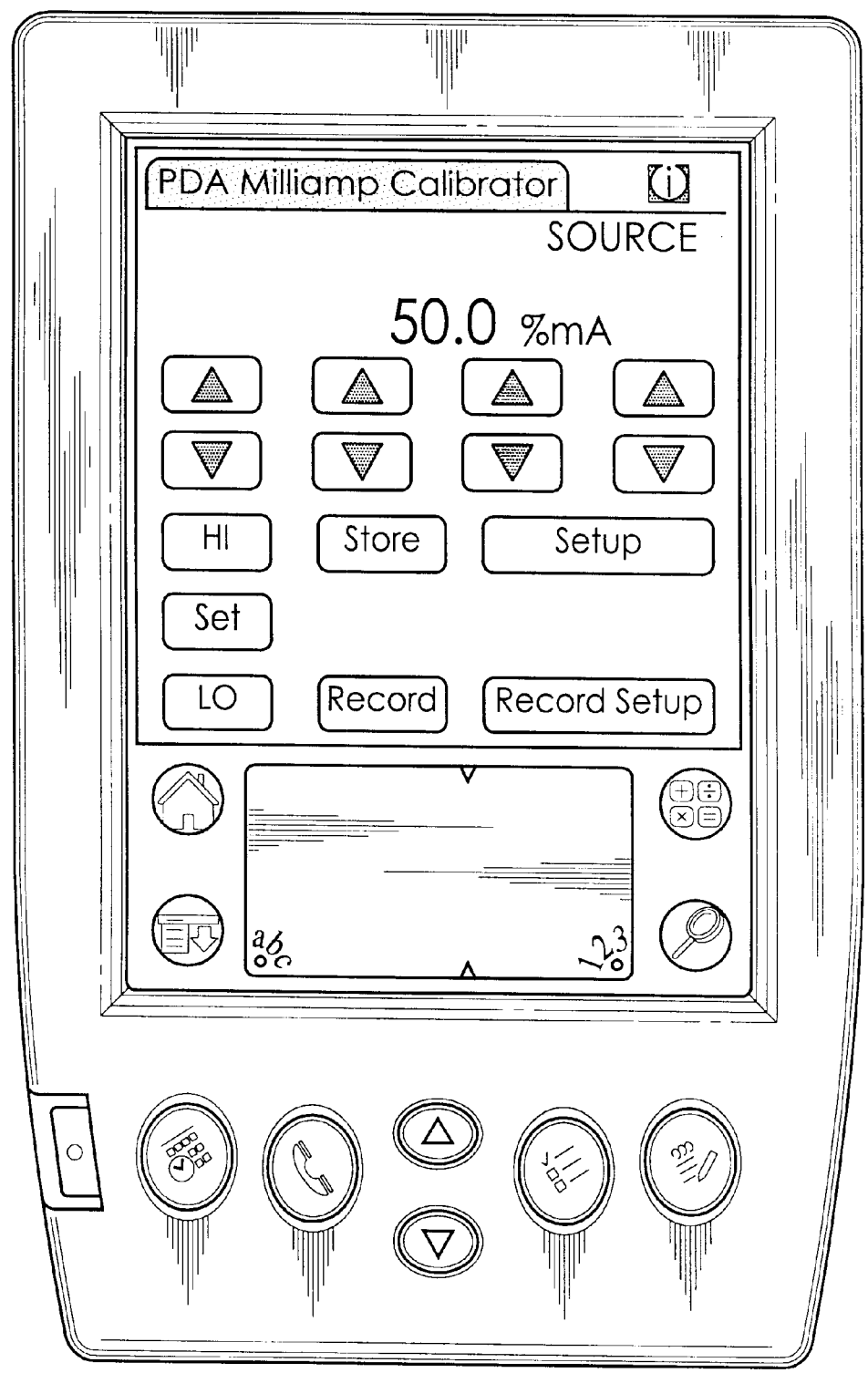
FIG. 46 is a drawing of the screen display showing the sourcing current function of the % milliamp sourcing procedure.
Figure 47:
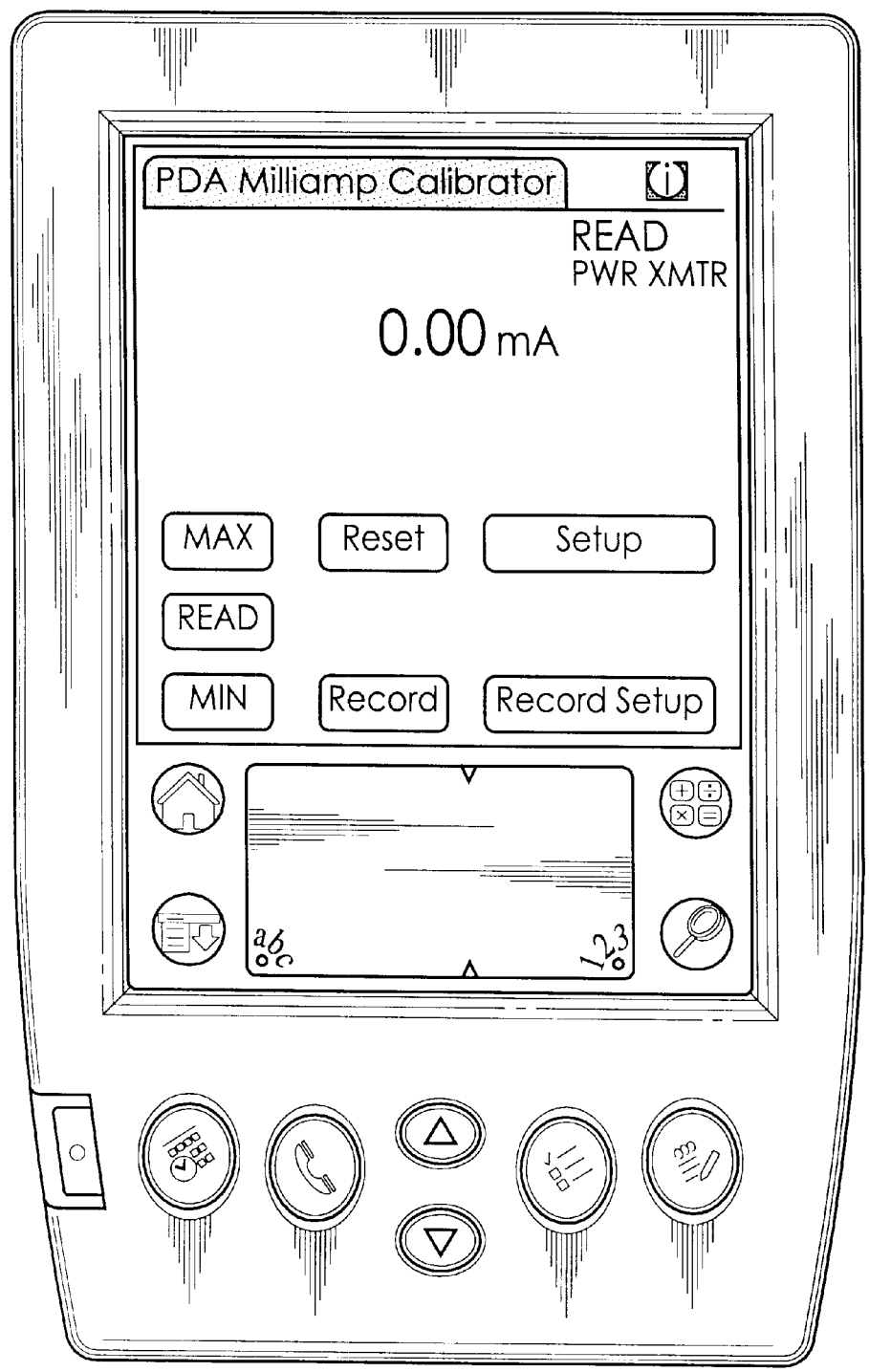
FIG. 47 is a drawing of the screen display showing the power transmitter read current function.
Figure 48:
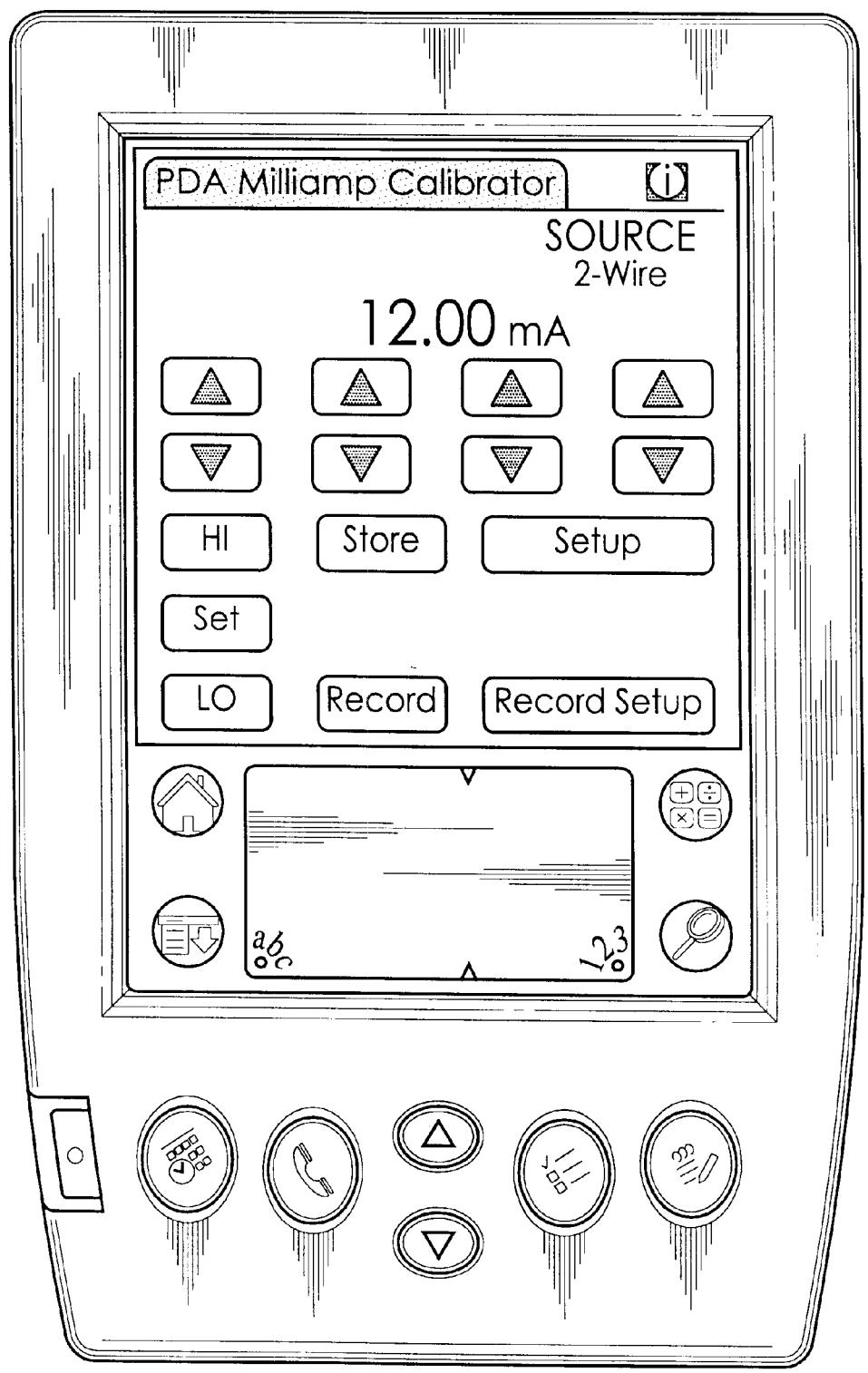
FIG. 48 is a drawing showing the two wire source current function.

FIG. 46 shows the screen display for the percent milliamp source mode. FIG. 47 shows the display for the power transmitter milliamp read mode, and FIG. 48 shows the display for the milliamp 2-wire source mode.

While the invention has been described in connection with certain presently preferred embodiments thereof, those skilled in the art will recognize that many modifications and changes may be made therein, without departing from the true spirit and scope of the invention, which accordingly is intended to be defined solely by the following claims.

What is claimed is:

1. A calibrator comprising:
    a housing;
    a traceable, controllable calibration source in the housing, the calibration source including memory for storing information identifying the calibrator source;
    a data connector coupled to the calibration source;
    a hand held computer removably attached to the housing and connected to the data connector, the computer including input means for receiving input from a user for controlling the calibration source and output means for displaying the identifying information to the user.

2. The calibrator of claim 1 in which the hand held computer comprises means for receiving and storing calibration data from the user.

3. The calibrator of claim 2 in which the hand held computer comprises means for transferring the stored calibration data, and the identifing information to another computer.

4. The calibrator of claim 1 in which the input means comprises a touch-screen.

5. The calibrator of claim 1 in which the hand held computer comprises hot sync means for transferring data to a database computer.

6. The calibrator of claim 1 comprising a controller connected to the calibration source and responsive to signals generated by the hand held computer for controlling the magnitude of the source signals.

7. The calibrator of claim 6 comprising a digital to analog converter, connected to the controller for adjusting the value of a source signal.

8. The calibrator of claim 1 comprising a signal sensor for measuring the value of an electrical signal and an interface coupled to the signal sensor and the data connector for transferring a value of the sensed signal to the hand held computer.

9. The calibrator of claim 1 in which the hand held computer if responsive to user input to generate a command signal and the calibrator includes a detector responsive to the comma signal for initiating execution of the command.

10. The calibrator of claim 1 comprising memory for sequentially storing measured values and a controller for transferring the most recent measured value to the hand held computer in response to a request therefor.

11. The calibrator of claim 1 comprising measurement means in the housing for providing measured data to the data connector.

12. The calibrator of claim 11 in which the hand held computer comprises means for storing measured data.

13. The calibrator of claim 12 in which the hand held computer comprises means for displaying the measured data.

14. An instrument/device calibrator adapted to be connected to a hand held computer, comprising:
    a connector for connecting the calibrator to a hand held computer;
    a controller connected to the connector for receiving a control signal from the hand held computer and transferring data signals from the calibrator to the hand held computer in response to data requests;
    a controllable calibration source responsive to signals generated by the hand held computer for producing calibration signals;
    memory in the calibrator for storing calibration results and transferring the calibration results through the connector.

15. The calibrator of claim 14 comprising a memory storing data identifying the calibrator and responsive to a request from a hand held computer for transferring the data to the hand held computer.

16. The calibrator of claim 14 including a data base for storing instrument records and related data records showing the results of calibration of an instrument.

* * * * *

UNITED STATES PATENT AND TRADEMARK OFFICE
CERTIFICATE OF CORRECTION

PATENT NO. : 6,584,421 B1
DATED : June 24, 2003
INVENTOR(S) : Clarridge et al.

It is certified that error appears in the above-identified patent and that said Letters Patent is hereby corrected as shown below:

<u>Title page,</u>
Item [73], Assignee, "Rochester, NY" should read -- Everett, WA --.

<u>Drawings,</u>
Sheet 15, Figure 21, the reference numeral reading "500" should read -- 501 --.
Sheet 15, Figure 21, the reference numeral reading "510" should read -- 511 --.
Sheet 16, Figure 22, the reference numeral reading "520" should read -- 521 --.

<u>Column 1,</u>
Line 44, "a-traceable" should read -- traceable --.
Line 59, "compute" should read -- computer --.

<u>Column 2,</u>
Line 26, "tag. IDs" should read -- tag IDs --.

<u>Column 12,</u>
Line 19, "comma" should read -- command --.

Signed and Sealed this

Second Day of December, 2003

JAMES E. ROGAN
*Director of the United States Patent and Trademark Office*